(12) United States Patent
Guo et al.

(10) Patent No.: US 12,089,424 B2
(45) Date of Patent: Sep. 10, 2024

(54) PHOTODETECTORS WITH SEMICONDUCTOR ACTIVE LAYERS FOR UNDER-DISPLAY FINGERPRINT AND GESTURE SENSORS

(71) Applicant: THE REGENTS OF THE UNIVERSITY OF MICHIGAN, Ann Arbor, MI (US)

(72) Inventors: Lingjie J. Guo, Ann Arbor, MI (US); Qingyu Cui, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 102 days.

(21) Appl. No.: 17/423,814

(22) PCT Filed: Jan. 16, 2019

(86) PCT No.: PCT/US2019/013856
§ 371 (c)(1),
(2) Date: Jul. 16, 2021

(87) PCT Pub. No.: WO2020/149842
PCT Pub. Date: Jul. 23, 2020

(65) Prior Publication Data
US 2022/0085310 A1  Mar. 17, 2022

(51) Int. Cl.
*H01L 31/00* (2006.01)
*H10K 30/10* (2023.01)
(Continued)

(52) U.S. Cl.
CPC .............. *H10K 30/10* (2023.02); *H10K 30/82* (2023.02); *H10K 39/30* (2023.02)

(58) Field of Classification Search
CPC . H01L 51/4213; H01L 27/305; H01L 51/442; H01L 27/307; H01L 51/4246;
(Continued)

(56) References Cited

U.S. PATENT DOCUMENTS 5,703,436 A * 12/1997 Forrest ................. H10K 50/125
257/E33.056
6,303,943 B1 * 10/2001 Yu ......................... B82Y 10/00
257/431

(Continued)

OTHER PUBLICATIONS

Lee, Jae Yong et al., "Decorative power generating panels creating angle insensitive transmissive colors," *Scientific Reports*, 4, 4192, DOI: 10.1038/srep04192 (Published: Feb. 28, 2014) pp. 1-6.
(Continued)

*Primary Examiner* — Vu A Vu
(74) *Attorney, Agent, or Firm* — Harness, Dickey & Pierce, P.L.C.

(57) ABSTRACT

In various aspects, the present disclosure provides photodetector devices that may be provided in arrays. The photodetector includes a first electrode, a second electrode, and a photoactive layer assembly disposed therebetween. The photoactive layer assembly comprises a first charge transport layer, a second charge transport layer, and an amorphous silicon (a-Si) material substantially free of doping and being substantially free of doping disposed between the first charge transport layer and the second charge transport layer. The photodetector device transmits light in a predetermined range of wavelengths and is capable of generating detectable photocurrent when light having a light intensity of less than or equal to about 50 Lux is directed towards the photodetector device.

20 Claims, 14 Drawing Sheets

(51) Int. Cl.
*H10K 30/82* (2023.01)
*H10K 39/30* (2023.01)

(58) Field of Classification Search
CPC .. H01L 51/445; H01L 31/1055; Y02E 10/549
USPC .......................................................... 345/156
See application file for complete search history.

(56) References Cited

U.S. PATENT DOCUMENTS

| | | | | |
|---|---|---|---|---|
| 7,196,366 | B2* | 3/2007 | Forrest | H10K 30/30 |
| | | | | 257/292 |
| 7,270,871 | B2* | 9/2007 | Jiang | H01B 1/127 |
| | | | | 252/589 |
| 7,375,370 | B2* | 5/2008 | Forrest | H10K 30/20 |
| | | | | 136/263 |
| 7,915,701 | B2* | 3/2011 | Forrest | H10K 30/20 |
| | | | | 136/265 |
| 8,017,863 | B2* | 9/2011 | Forrest | B82Y 10/00 |
| | | | | 136/263 |
| 8,097,868 | B2* | 1/2012 | Monaco | H01L 31/173 |
| | | | | 250/551 |
| 8,178,828 | B2* | 5/2012 | Yamaguchi | H01L 27/14603 |
| | | | | 250/221 |
| 8,344,142 | B2* | 1/2013 | Marder | C09B 57/008 |
| | | | | 546/37 |
| 8,716,646 | B2* | 5/2014 | Hirose | H01L 31/02019 |
| | | | | 250/214 R |
| 9,147,715 | B2* | 9/2015 | Afzali-Ardakani | |
| | | | | H01L 29/1004 |
| 9,685,567 | B2* | 6/2017 | Huang | H01L 31/02 |
| 9,711,674 | B2* | 7/2017 | Kuznicki | H01L 31/0747 |
| 9,882,074 | B2* | 1/2018 | Yang | H01L 31/032 |
| 10,333,016 | B2* | 6/2019 | Uzu | H10K 30/80 |
| 10,777,700 | B2* | 9/2020 | Ma | G01J 1/42 |
| 2007/0097481 | A1* | 5/2007 | Burdis | G02F 1/1525 |
| | | | | 359/265 |
| 2009/0140645 | A1 | 6/2009 | Lin et al. | |
| 2010/0155707 | A1* | 6/2010 | Anthopoulos | H01L 51/428 |
| | | | | 257/E51.027 |
| 2012/0001060 | A1 | 1/2012 | He | |
| 2013/0048958 | A1 | 2/2013 | Lim et al. | |
| 2014/0061486 | A1* | 3/2014 | Bao | G01J 1/429 |
| | | | | 29/25.01 |
| 2014/0263945 | A1* | 9/2014 | Huang | H01L 31/1136 |
| | | | | 257/40 |
| 2015/0295099 | A1* | 10/2015 | Leschkies | H01L 31/077 |
| | | | | 136/246 |
| 2016/0035979 | A1 | 2/2016 | Lee et al. | |
| 2016/0268510 | A1* | 9/2016 | Moon | C07F 7/22 |
| 2017/0005283 | A1 | 1/2017 | Al-Ghamdi et al. | |
| 2017/0077429 | A1* | 3/2017 | Huang | H10K 30/35 |
| 2017/0084776 | A1 | 3/2017 | Gessner et al. | |
| 2017/0278643 | A1* | 9/2017 | El-Kady | H01G 11/66 |
| 2017/0358398 | A1* | 12/2017 | Beaumont | H01L 51/422 |
| 2018/0016456 | A1* | 1/2018 | Wang | C09D 11/102 |
| 2018/0075977 | A1* | 3/2018 | Huang | H01L 51/424 |
| 2019/0034704 | A1* | 1/2019 | Qiu | G06V 10/764 |
| 2019/0043925 | A1* | 2/2019 | So | H01L 51/4206 |

OTHER PUBLICATIONS

Lee, Kyu-Tae et al., "Colored ultrathin hybrid photovoltaics with high quantum efficiency," *Light: Science & Applications*, 3, e215, DOI:10.1038/lsa.2014.96 (Published: Oct. 24, 2014). pp. 1-7.

Agostinelli, T., et al, "A polymer/fullerene based photodetector with extremely low dark current for x-ray medical imaging applications", Applied Physics Letters, 93 (2008) Abstract only.

Horowitz, Gilles, "Organic thin film transistors: from theory to real devices", Research Gate Article, Jun. 3, 2014, pp. 1945-1962.

Esmaeili-Rad, Mohammad R., et al, "High Performance Molybdenm Disulfide Amorphous Silicon Heterojunction Photodetector", Scientific Reports, published Aug. 2, 2013, pp. 1-6.

International Search Report and Written Opinion of the International Searching Authority issued in PCT/US2020/013856, mailed on Jun. 7, 2019; ISA/US.

International Preliminary Report on Patentability (Chapter II) issued in PCT/US2019/013856. mailed Jun. 7, 2019, IPEA/US.

Search Report and Written Opinion issued Jan. 27, 2023, for Singapore Application No. 11202107556S; 10 pages.

* cited by examiner

PHOTODETECTORS WITH SEMICONDUCTOR ACTIVE LAYERS FOR UNDER-DISPLAY FINGERPRINT AND GESTURE SENSORS

CROSS-REFERENCE TO RELATED APPLICATIONS

This application is a 371 U.S. National Phase of International Application No. PCT/US2019/013856 filed on Jan. 16, 2019. The entire disclosure of the above application is incorporated herein by reference.

FIELD

The present disclosure relates to photodetector devices employing semiconductor active materials that can be deposited over a large area, such as amorphous silicon (a-Si), for use in display and touchscreen devices, for example, as under-display fingerprint sensors and gesture sensors.

BACKGROUND

This section provides background information related to the present disclosure which is not necessarily prior art.

Under-display or under-screen optical fingerprint sensors are replacing traditional capacitive touch sensors in mobile devices and touch screen displays to provide additional front screen space to enable full screen displays. Previously, crystalline silicon (Si) based complementary metal-oxide-semiconductor (CMOS) photodetectors have been developed for optical under-screen fingerprint recognition. However, traditional display panels incorporate amorphous silicon (a-Si) or low temperature polysilicon as a circuit board for backplane control circuitry, so it would be most beneficial to be able to integrate the optical fingerprint sensors directly onto the board and use similar semiconductor materials, for ease of manufacturing and integration, and significant cost reduction.

SUMMARY

This section provides a general summary of the disclosure, and is not a comprehensive disclosure of its full scope or all of its features.

In certain aspects, the present disclosure relates to a photodetector device comprising a first electrode, a second electrode, and a photoactive layer assembly disposed between the first electrode and the second electrode. The photoactive layer assembly comprises a first charge transport layer, a second charge transport layer, and a semiconductor layer substantially free of doping disposed between the first charge transport layer and the second charge transport layer. The photodetector device has a ratio of photocurrent to dark current of greater than or equal to about $10^2$ measured at a voltage bias of 0 to about −5V.

In certain aspects, at least one of the first electrode or the second electrode is transparent to light in a predetermined range of wavelengths.

In certain aspects, the semiconductor layer comprises a semiconductor material selected from a group consisting: an amorphous silicon (a-Si), a polycrystalline silicon, an organolead halide perovskite semiconductor, an organic semiconductor, a quantum dot, an oxide semiconductor, a two-dimensional semiconductor, and combinations thereof.

In certain aspects, the photodetector device defines a first surface exposed to an external environment that is opaque. The first electrode comprises a material selected from the group consisting of: silver (Ag), aluminum (Al), nickel (Ni), copper (Cu), molybdenum (Mo), palladium (Pd), and combinations thereof.

In certain further aspects, the first electrode is an anode comprising a material selected from the group silver (Ag), nickel (Ni), molybdenum (Mo), and alloys and combinations thereof.

In certain aspects, the first electrode is transparent to light in a predetermined range of wavelengths. The first electrode optionally comprises a material selected from the group consisting of: indium tin oxide (ITO), fluorine-doped tin oxide (FTO), zinc tin oxide (ZTO), zinc oxide (ZnO), aluminum zinc oxide (AZO), or indium zinc oxide (IZO), and combinations thereof.

In certain aspects, the first electrode is transparent to light in a predetermined range of wavelengths and comprises an ultrathin layer comprising silver (Ag) disposed between a first metal oxide layer and a second metal oxide layer. The second metal oxide layer is the first charge transport layer that serves as a hole transport layer.

In certain aspects, the first electrode is an anode and the second electrode is a cathode. The first charge transport layer is a hole transport layer disposed between the anode and the semiconductor layer. The second charge transport layer is an electron transport layer disposed between the semiconductor layer and the cathode.

In certain further aspects, the hole transport layer and the electron transport layer independently comprise a metal oxide.

In certain further aspects, the hole transport layer comprises a metal oxide and the electron transport layer comprises an organic material.

In certain further aspects, the hole transport layer comprises a metal oxide selected from the group consisting of: vanadium oxide ($VO_x$), molybdenum oxide (MoOx), tungsten trioxide ($WO_x$), nickel oxide ($NiO_x$), and combinations thereof.

In certain further aspects, the electron transport layer comprises a metal oxide selected from the group consisting of: zinc oxide (ZnO), titanium dioxide ($TiO_2$), zinc tin oxide ($SnZnO_3$), and combinations thereof.

In certain further aspects, the electron transport layer comprises a first layer comprising zinc oxide (ZnO) nanoparticles and a second layer comprising polyetherimide (PEI).

In certain further aspects, the hole transport layer comprises a p-type silicon dioxide (p-$SiO_2$) and the electron transport layer comprises an n-type silicon dioxide (n-$SiO_2$) material.

In certain aspects, the semiconductor layer has a thickness of less than or equal to about 100 nm and the first charge transport layer and the second charge transport layer respectively have a thickness of less than or equal to about 20 nm.

In certain aspects, a device comprises an array of photodetector devices. The photodetector device may comprise a first electrode, a second electrode, and a photoactive layer assembly disposed between the first electrode and the second electrode. The photoactive layer assembly comprises a first charge transport layer, a second charge transport layer, and a semiconductor layer substantially free of doping disposed between the first charge transport layer and the second charge transport layer. The photodetector device has a ratio of photocurrent to dark current of greater than or equal to about $10^2$ measured at a voltage bias of 0 to about −5V. The device is capable of generating detectable photocurrent when light with a light intensity of less than or equal to about 50 Lux is directed towards the photodetector device.

In certain other aspects, the present disclosure relates to a photodetector device that comprises a first electrode, a second electrode, an optional third electrode, a charge donor or acceptor region, and a semiconductor active layer disposed adjacent to the charge donor or acceptor region and in contact with the first electrode and the second electrode that serves as a conducting channel. The photodetector device further comprises an insulator layer defining a first side disposed adjacent to the semiconductor active layer and a second side opposite to the first side. The photodetector device is a phototransistor that is capable of transmitting light in a predetermined range of wavelengths.

In certain aspects, the photodetector device further comprises a third electrode. The third electrode is disposed adjacent to the second side of the insulator layer.

In certain aspects, the semiconductor active layer comprises a material selected from the group consisting of: amorphous silicon (a-Si), indium gallium zinc oxide (IGZO), an organic semiconductor, a polycrystalline silicon, a two-dimensional semiconductor, metal oxide, and combinations thereof.

In certain aspects, the charge donor or acceptor layer comprises a material selected from the group consisting of: quantum dots, two-dimensional (2D) semiconductors, graphene, a semiconductor having distinct bandgap and offset band edges, and combinations thereof.

In certain aspects, the photodetector device has a responsivity of greater than or equal to about $10^3$ A/W.

In certain aspects, a device comprises an array of the photodetector devices like those described above as pixels. The device is capable of generating detectable photocurrent when light with a light intensity of less than or equal to about 50 Lux is directed towards the photodetector device.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4A:
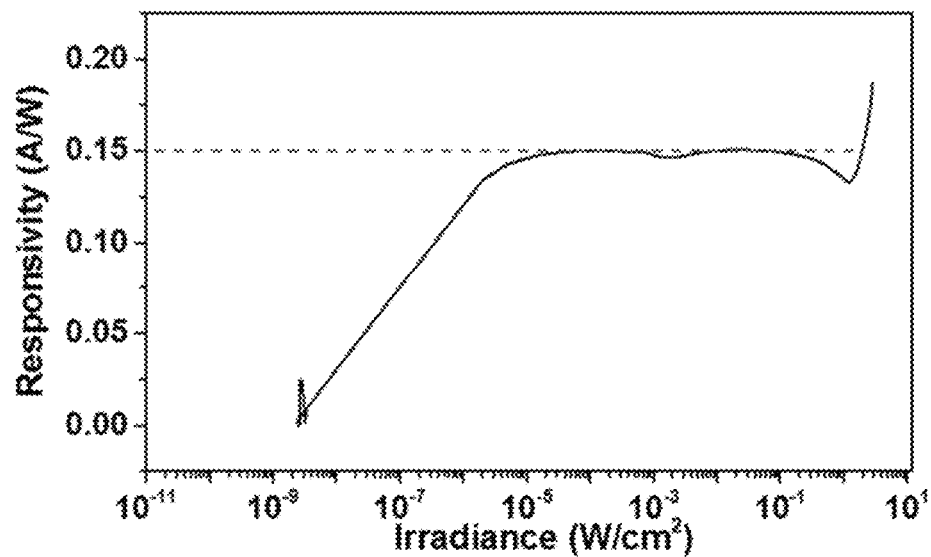
Figure 4B:
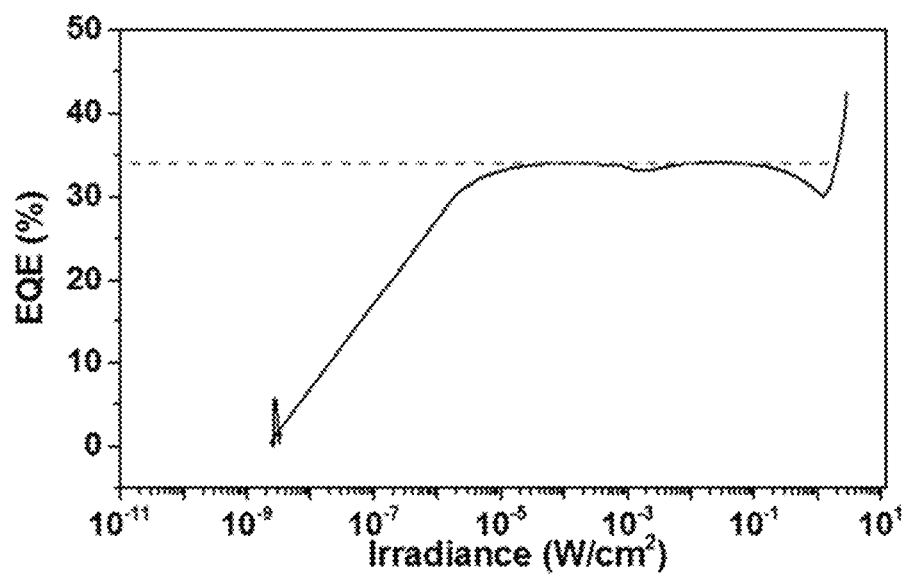

FIGS. 4A-4B. FIG. 4A shows calculated responsivity and FIG. 4B shows external quantum efficiency (EQE) for a photodiode photodetector prepared in accordance with certain aspects of the present disclosure.

Figure 5:
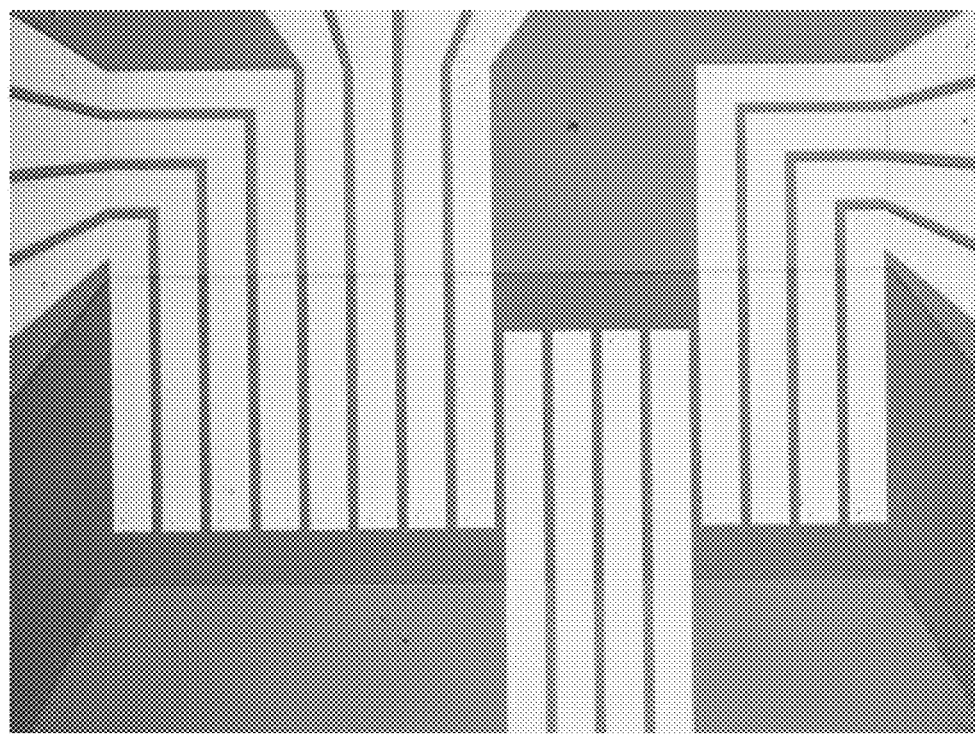

FIG. 5 is a photograph of an overhead view of an array of photodiode photodetectors prepared in accordance with certain aspects of the present disclosure, where a light beam partly covers the array.

Figure 6A:
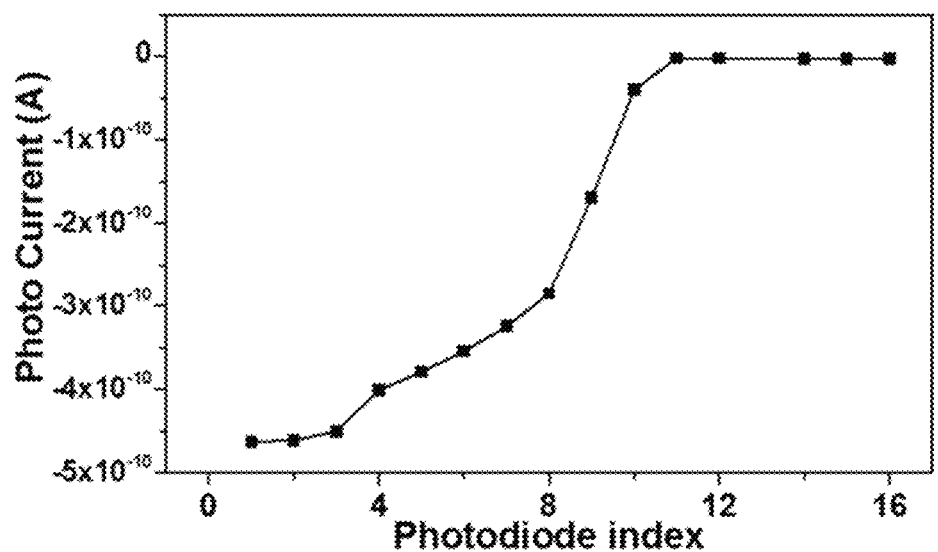
Figure 6B:
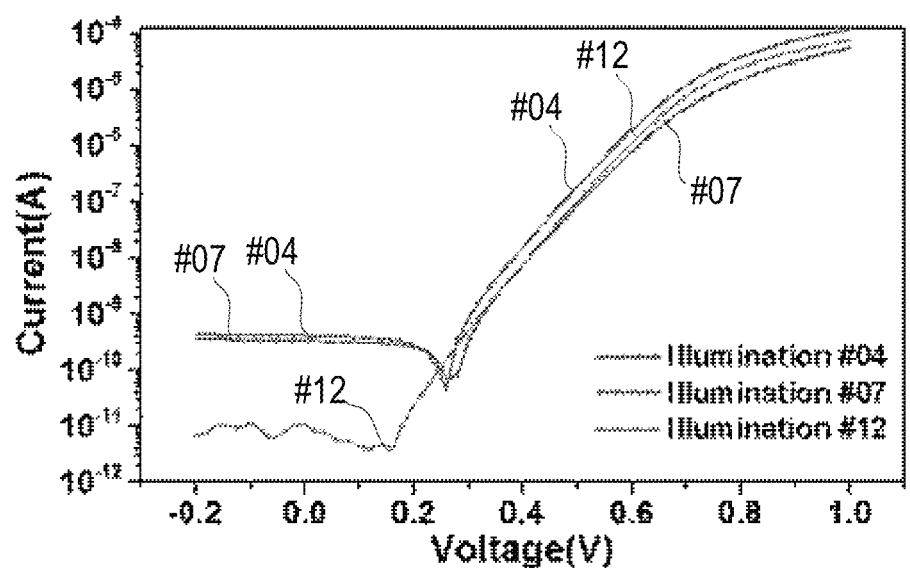

FIGS. 6A-6B. FIG. 6A shows a photo-current response from each pixel of the array of photodiode photodetectors from FIG. 5, while FIG. 6B shows representative examples of current versus voltage (I-V curves) for photodiodes/pixels 4, 7, and 12 from the array in FIG. 5.

Figure 7:
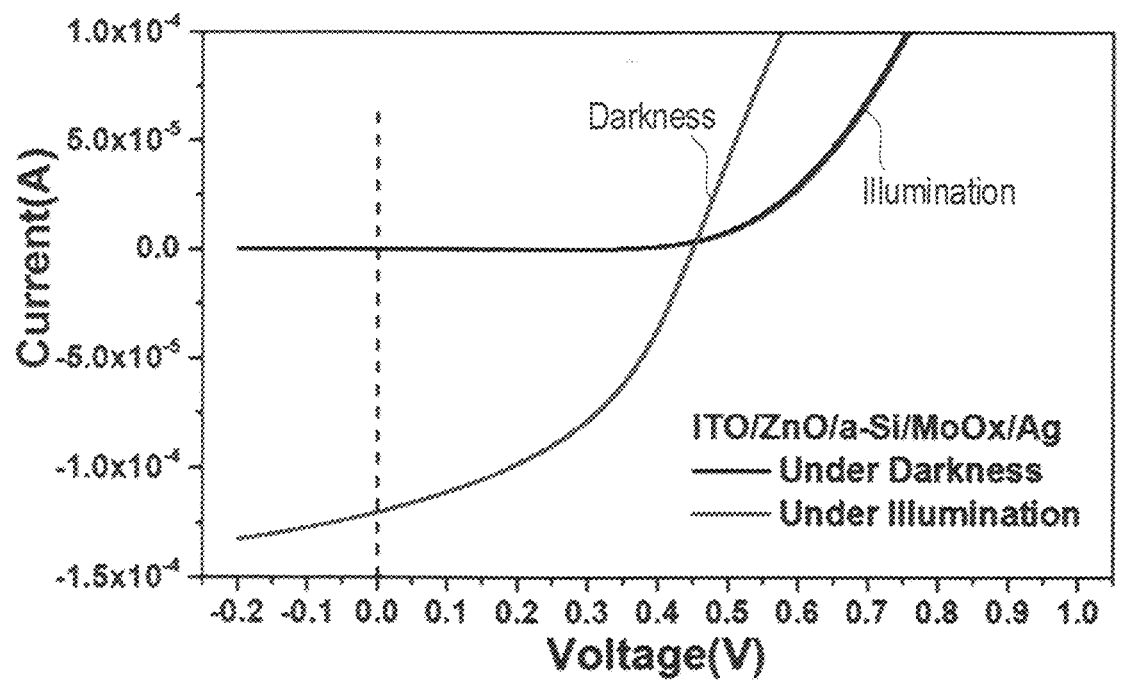

FIG. 7 shows current versus voltage performance (I-V curves) for a bottom illuminated photodiode photodetector design prepared in accordance with certain aspects of the present disclosure measured under dark (black curve) and light (red curve) conditions.

Figure 8:
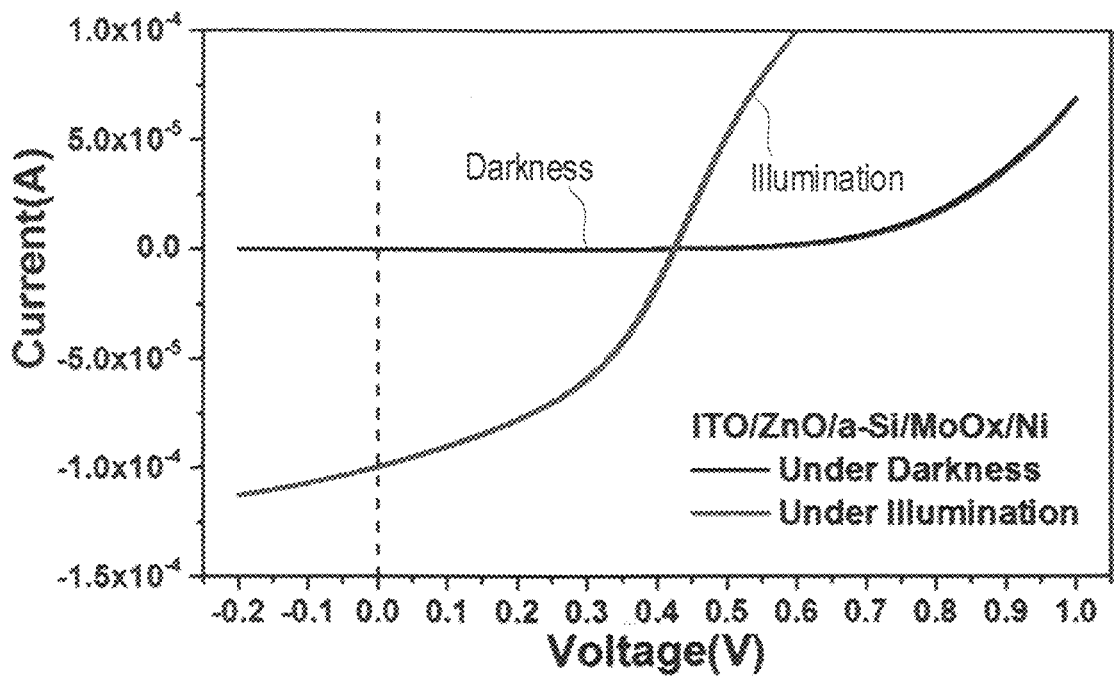

FIG. 8 shows current versus voltage performance (I-V curves) for a bottom illuminated photodiode photodetector design prepared in accordance with certain other aspects of the present disclosure measured under dark (black curve) and light (red curve) conditions.

Figure 9:
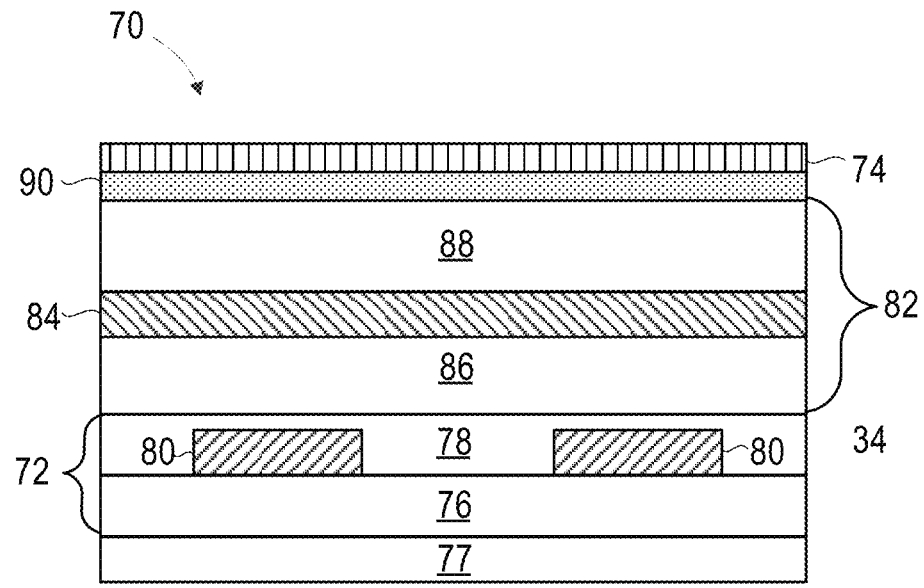

FIG. 9 shows another example of a hybrid photodiode photodetector prepared in accordance with certain aspects of the present disclosure.

Figure 10:
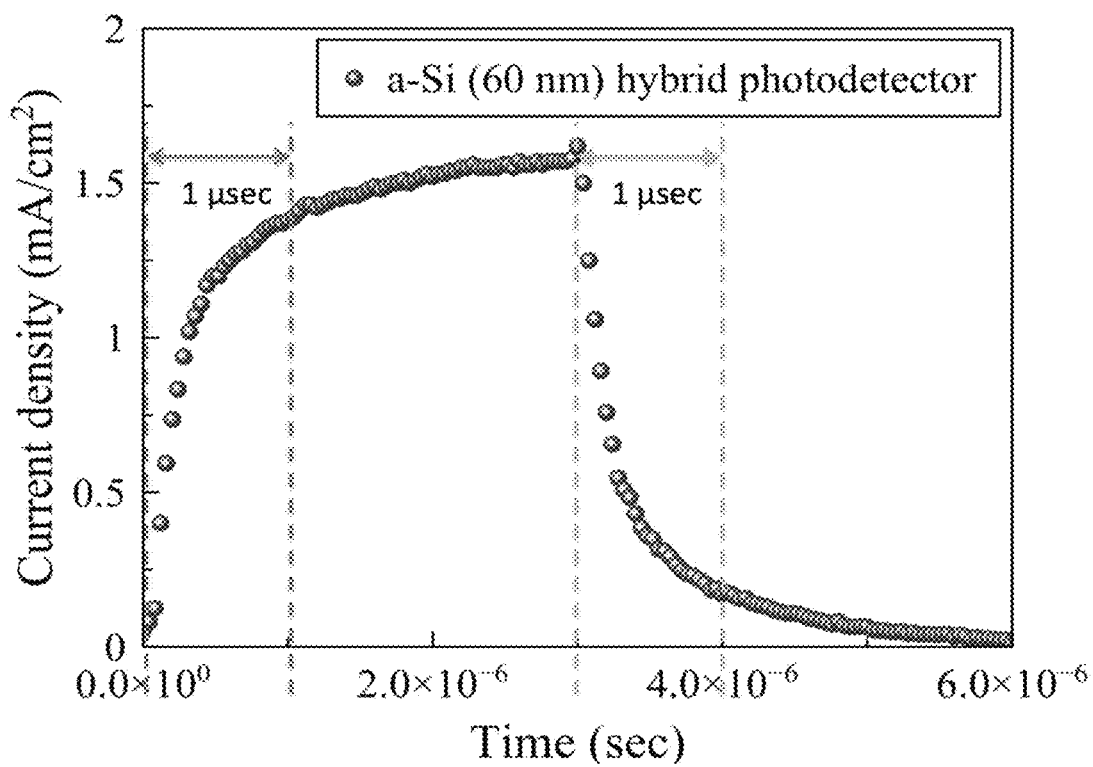

FIG. 10 shows high speed photo-response of rise and fall time of current density in a hybrid photodetector device design like that in FIG. 9.

Figure 11:
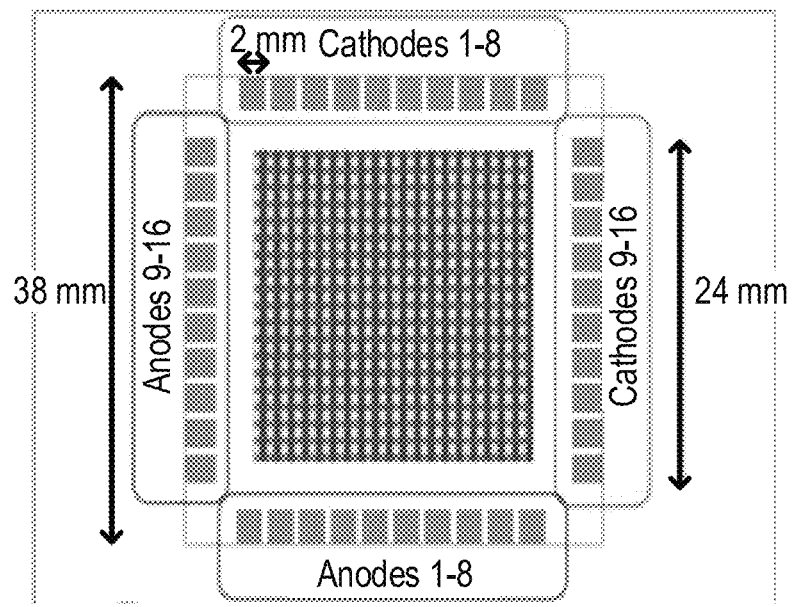

FIG. 11 shows a 16×16 array of photodetector device pixels.

Figure 12:
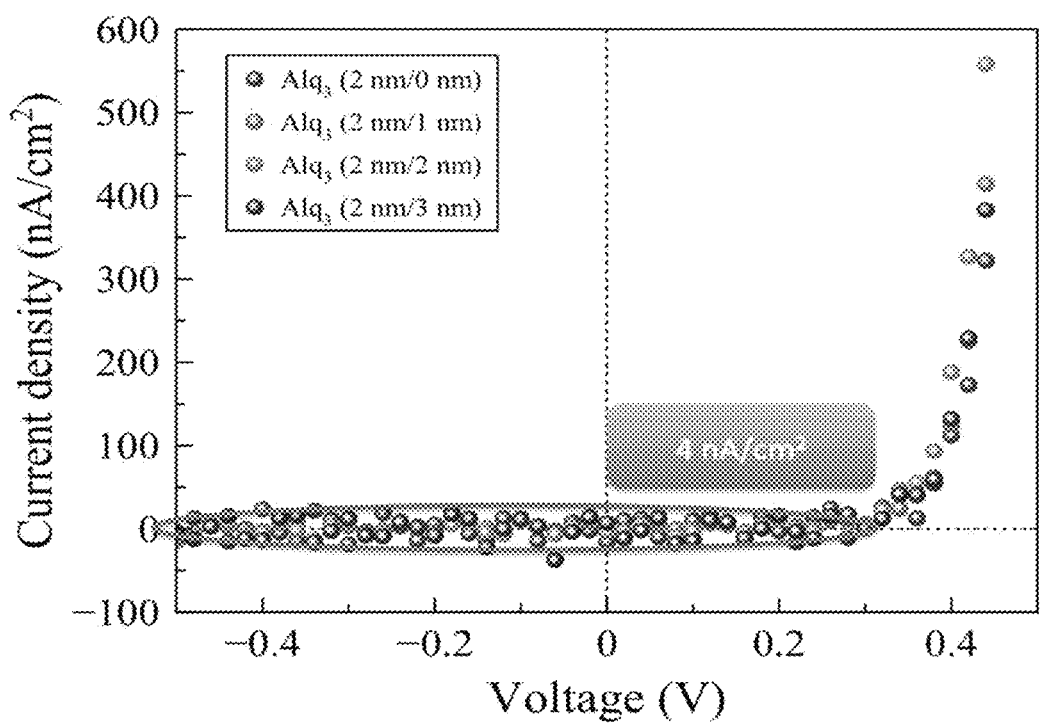

FIG. 12 shows suppression of dark current by introducing interfacial layers between the cathode and active material array.

Figure 13:
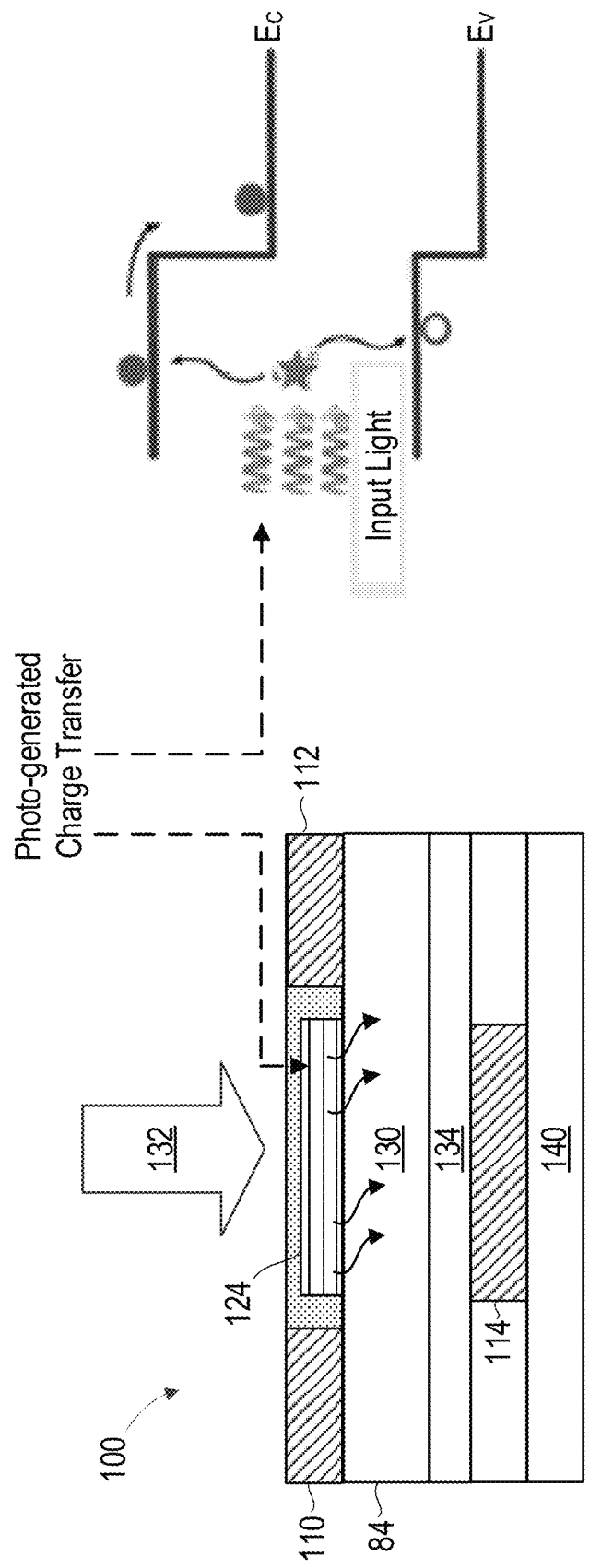

FIG. 13 shows a phototransistor photodetector device prepared in accordance with certain aspects of the present disclosure.

Figure 14:
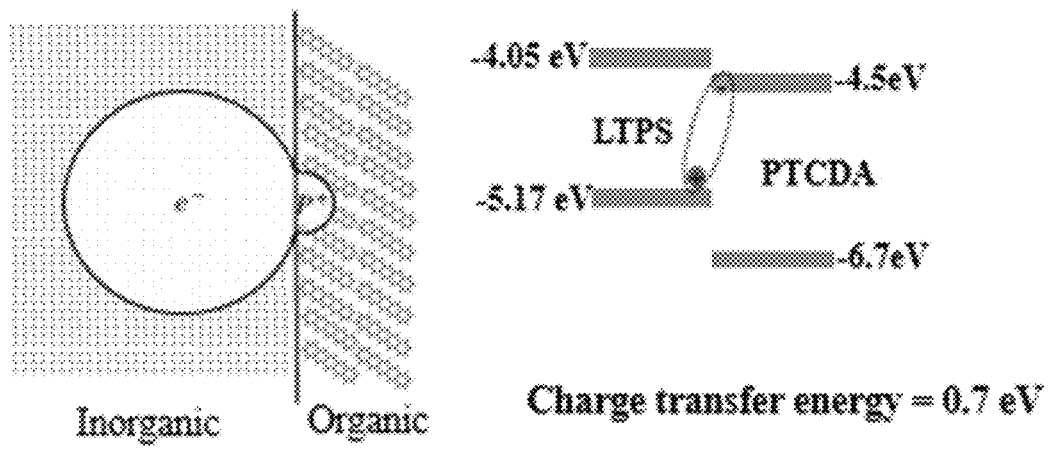

FIG. 14 a junction between a semiconductor active layer channel and a charge donor or acceptor region from a phototransistor photodetector device like that shown in FIG. 13.

Figure 15:
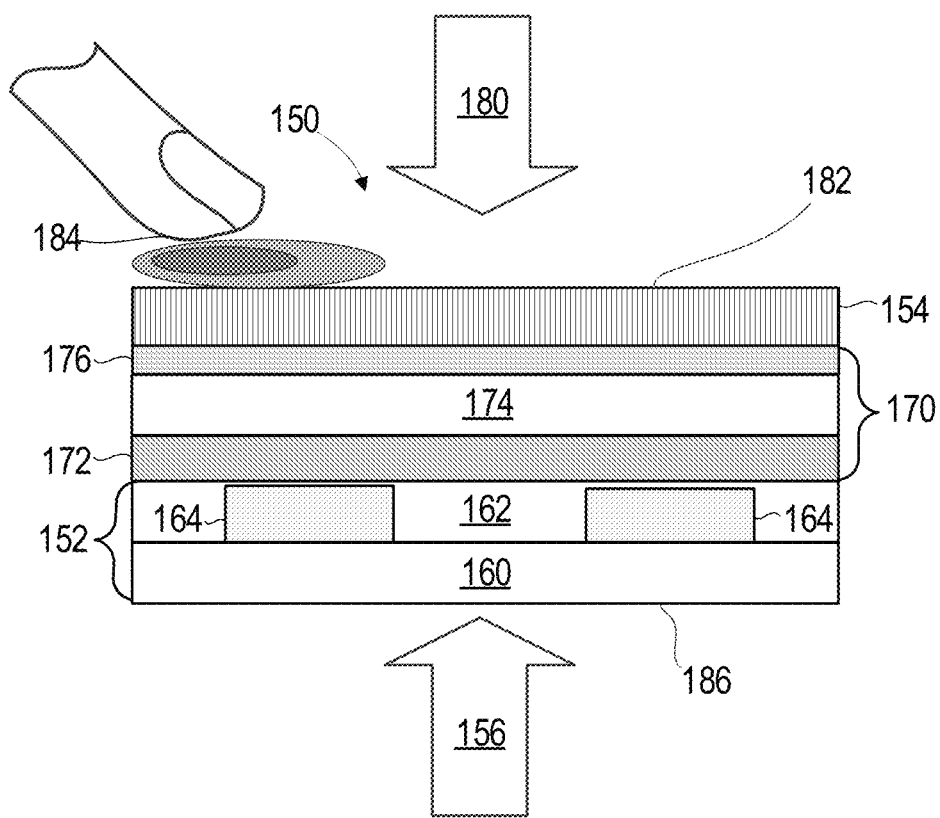

FIG. 15 shows a hybrid photodetector device capable of serving as a photodetector and as a photovoltaic device prepared in accordance with certain aspects of the present disclosure.

Figure 16:
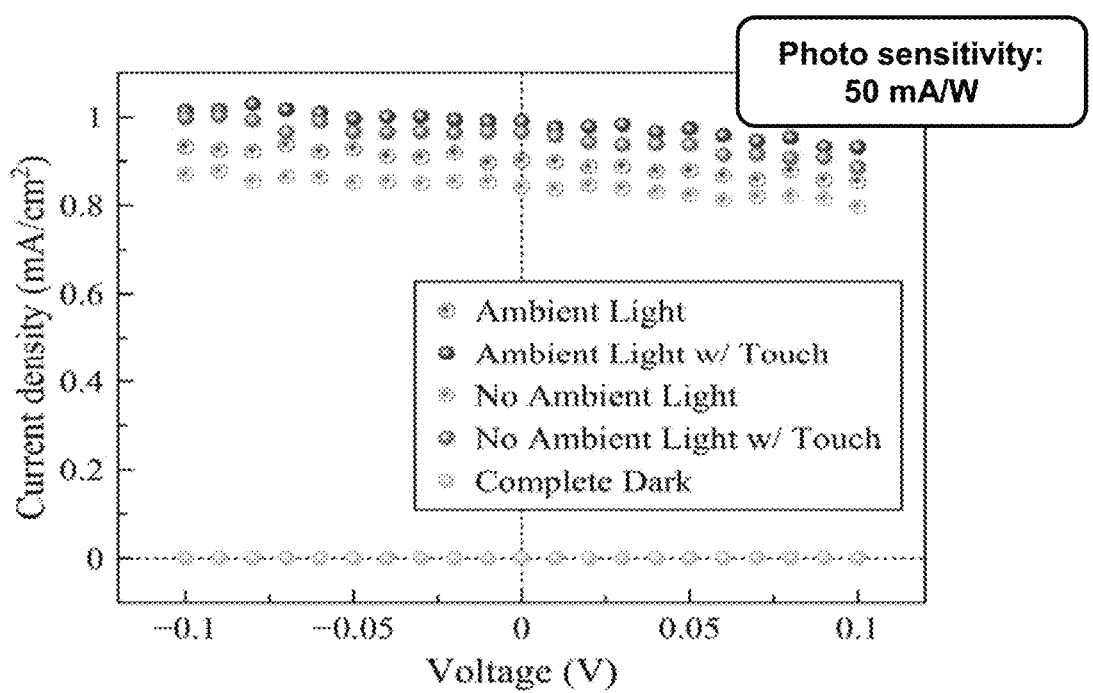

FIG. 16 shows photocurrent density versus voltage for a hybrid photodetector device like that shown in FIG. 15.

Figure 17:
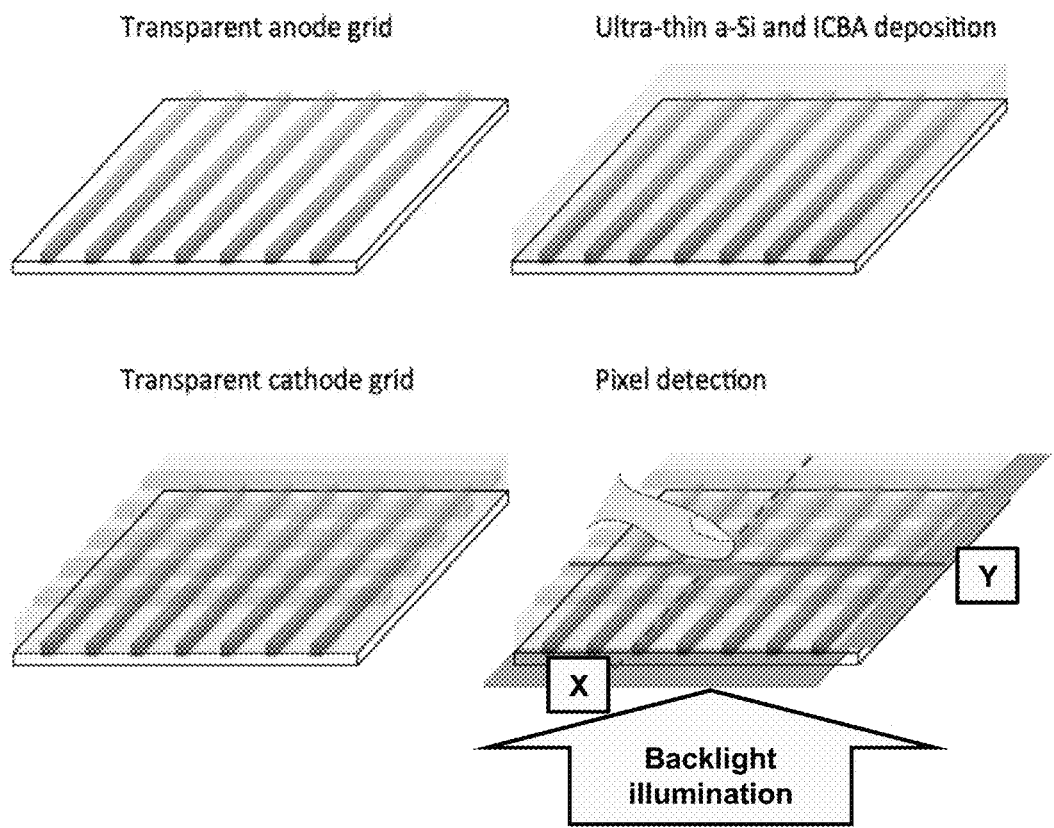

FIG. 17 illustrates an example of a method of fabrication of the transparent arrays with a-Si sandwiched by crossbar type cathode and anode grids that are transparent as well.

Figure 18A:
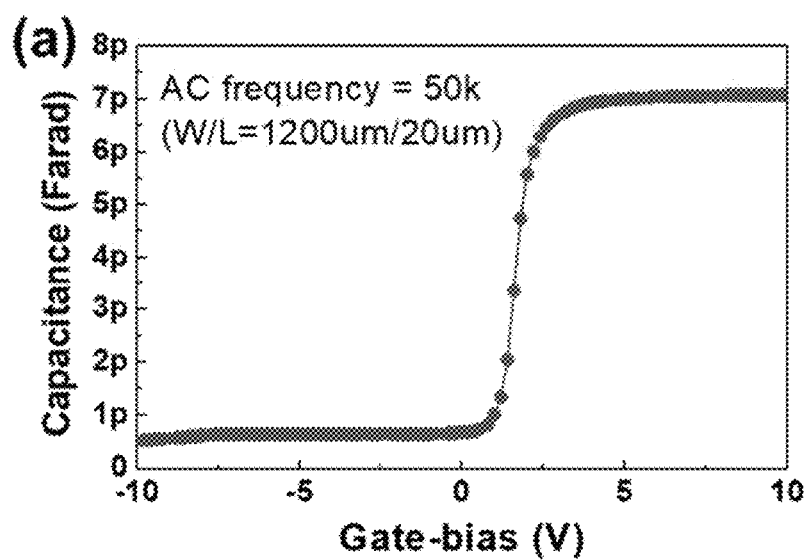
Figure 18B:
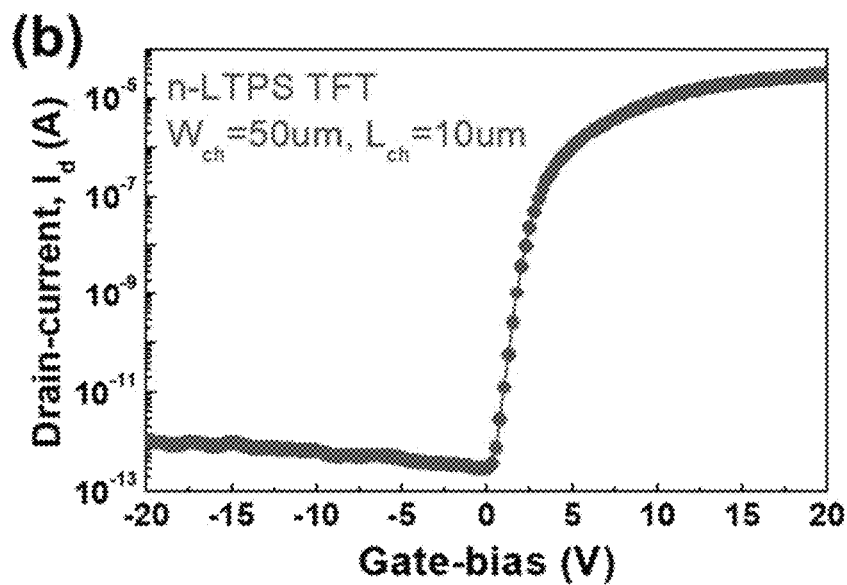

FIGS. 18A-18B. FIG. 18A shows capacitance versus gate bias for an n-type low-temperature-polysilicon (LTPS) thin-film-transistor (TFT) to assess photo response. FIG. 18B shows transfer-curves for an n-type low-temperature-polysilicon (LTPS) thin-film-transistor (TFT) with the channel length ($L_{ch}$) and width ($W_{ch}$) for 10 μm and 50 μm.

Figure 19A:
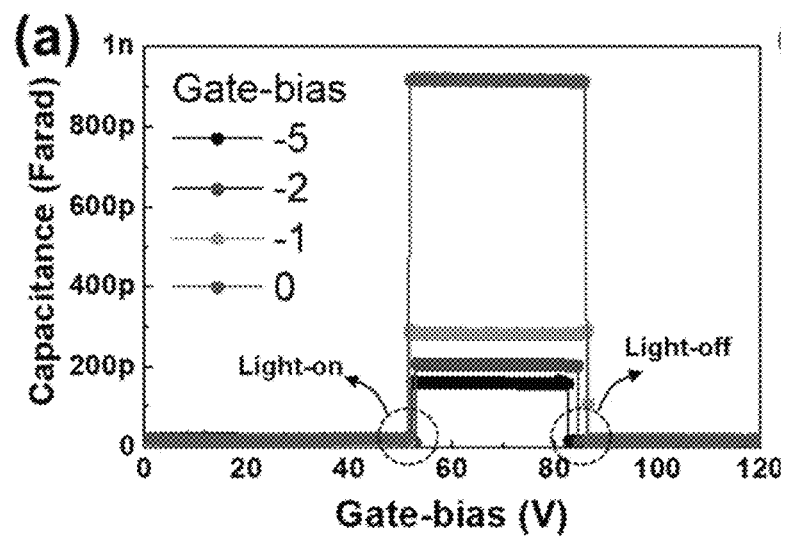
Figure 19B:
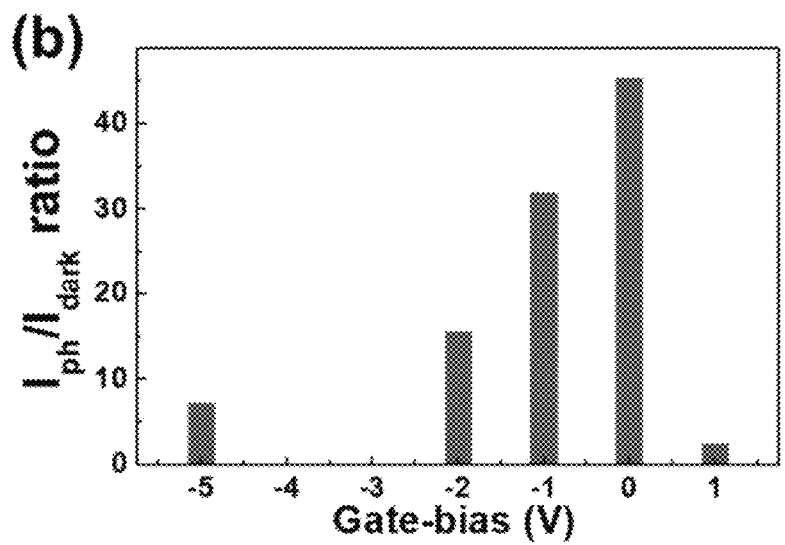

FIGS. 19A-19B. FIG. 19A shows capacitance versus gate bias for an n-type low-temperature-polysilicon (LTPS) thin-film-transistor (TFT) to assess photo-responses on the n-type LTPS-TFT under the turn-off gate-bias conditions and the light exposure using a white light emitting diode (LED). FIG. 19B shows a ratio of on/off (Photocurrent ($I_{ph}$)/Dark Current ($I_{dark}$)) versus gate-bias.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will not be described more fully with reference to the accompanying drawings.

In conventional amorphous silicon (a-Si) photodiodes (PD), usually p- or n-doped layers are used as charge transport layers for collecting photo-generated holes and electrons respectively and used as the anode or cathode contacts. In certain aspects, metal oxides or organic materials are instead used as charge transport layers. In various aspects, the present disclosure provides new highly sensitive photodetector devices capable of detection under low light conditions. For example, such photodetector devices may be used as under-display or under-screen optical fingerprint sensors that replace traditional capacitive touch sensors in mobile devices and touch screen displays. In this manner, the photodetector devices provided by certain aspects of the present disclosure enable front screen space to enable full screen displays. Advantageously, the photodetector devices according to certain aspects of the present disclosure incorporate active materials that include amorphous silicon (a-Si), suitable for integration within a circuit board for backplane control circuitry of such devices that are formed of amorphous silicon or low temperature polysilicon. In other variations, the photodetectors may be used as gesture sensors integrated onto a display panel. The amorphous (a-Si) based photodetectors described herein can satisfy the low-light detection needs for such applications, as well as finding applicability in other types of photodiodes based on charge transfer to a photoconductor, which can provide photoconductive gain.

Figure 1:
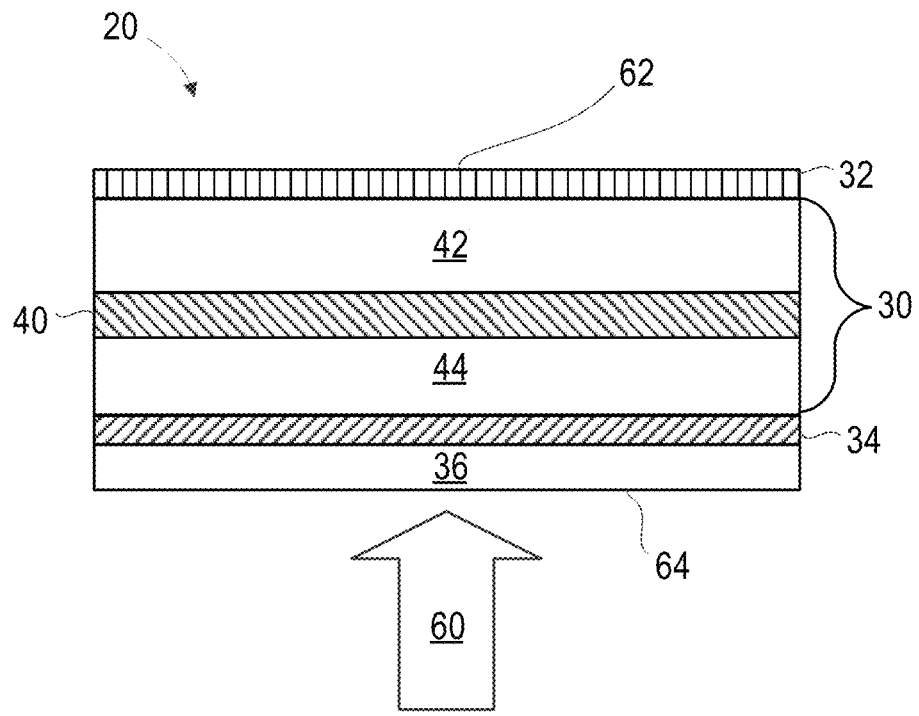
FIG. 1 is an example of a photodiode photodetector with bottom illumination prepared in accordance with certain aspects of the present disclosure.
Figure 2:
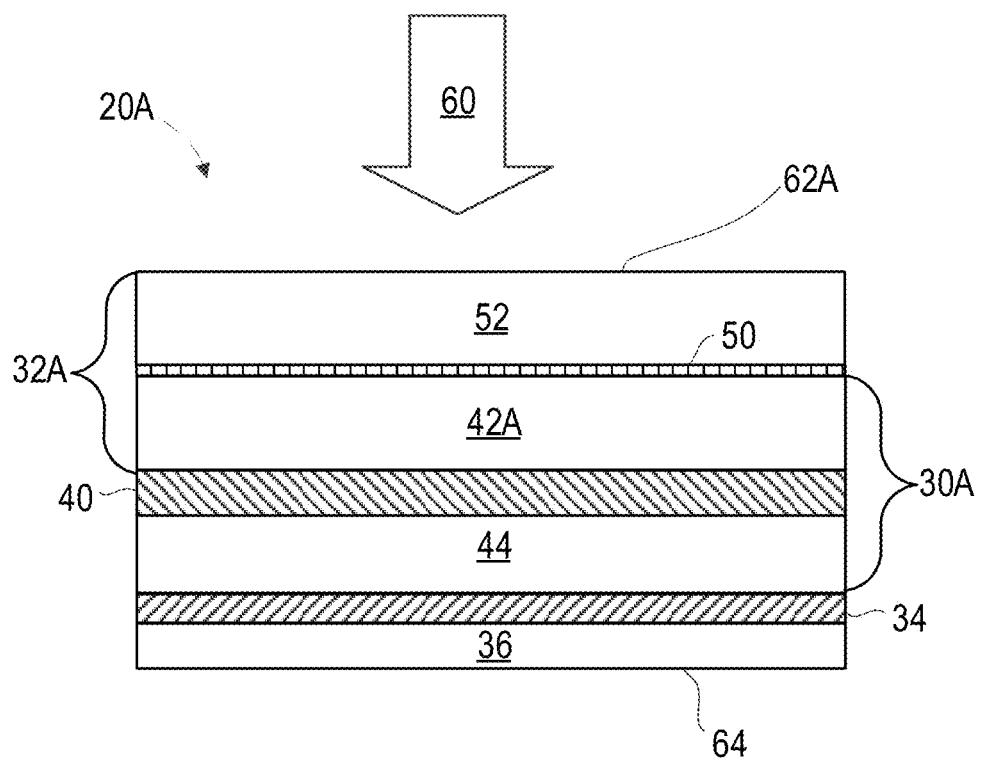
FIG. 2 is an example of a photodiode photodetector with top illumination prepared in accordance with certain aspects of the present disclosure.

FIGS. 1 and 2 shows examples of photodetector 20 or photodetector 20A having a photodiode configuration prepared in accordance with certain aspects of the present disclosure. In FIG. 1 a bottom illumination configuration of a photodetector 20 is shown, while in FIG. 2, a top illumination configuration of photodetector 20A is shown. In FIG. 1, the photodetector device 20 includes an active material assembly 30. The photodetector device 20 also includes a first electrode or anode 32 and a second electrode or cathode 34. While the anode 32 and cathode 34 are shown as a single metal layer, they may also be other structures, including a grid, mesh, or grating structure or a multilayered assembly, such as a dielectric-metal-dielectric assembly. The cathode 34 is disposed on a substrate 36, which may be transparent to one or more predetermined wavelength ranges of light, as discussed further below.

The active material assembly 30 includes a semiconductor active layer 40 that comprises a photoactive material, such as a semiconductor, for absorbing light and generating electric charge, as will be discussed in greater detail below. The active material assembly 30 may also at least one charge transport layer. The charge transport layer(s) may be chosen to facilitate charge injection or transfer at the electrodes. In certain aspects, the charge transport layer is an organic charge transport layer. In certain other aspects, the active material assembly 30 may further include an inorganic charge transfer layer along a side opposite to the first organic charge transport layer. Thus, the organic charge transport layer may be disposed on a first side of semiconductor active layer 40, while a second opposite side of the semiconductor active layer 40 is in contact with the inorganic charge transfer layer.

The active material assembly 30 may include a first charge transport layer 42 disposed between the semiconductor active layer 40 and the anode 32, which may serve as a hole transport layer (to transport holes between the anode 32 and semiconductor active layer 40). The active material assembly 30 may also include a second charge transport layer 44 disposed between the semiconductor active layer 40 and the cathode 34, which serves as an electron transport layer (to transport electrons between the semiconductor active layer 40 and the cathode 34). The anode 32 and cathode 34 thus sandwich the active material assembly 30.

In certain variations, the semiconductor active layer 40 may be a thin or ultra-thin photoactive layer. In certain aspects, a "thin" layer has a thickness of less than or equal to about 100 nm, optionally less than or equal to about 90 nm, optionally less than or equal to about 80 nm, optionally less than or equal to about 75 nm, optionally less than or equal to about 70 nm, optionally less than or equal to about 60 nm, and optionally less than or equal to about 50 nm. In certain other variations, an "ultra-thin" layer has a thickness of less than or equal to about 50 nm, optionally less than or equal to about 40 nm, optionally less than or equal to about 30 nm, optionally less than or equal to about 25 nm, optionally less than or equal to about 20 nm, optionally less than or equal to about 15 nm, optionally less than or equal to about 10 nm, and in certain variations, optionally less than or equal to about 5 nm. Notably, the thicknesses of the thin and ultrathin layers may overlap with one another. In certain aspects, a thin layer has a thickness of greater than or equal to about 5 nm to less than or equal to about 100 nm, optionally greater than or equal to about 20 nm to less than or equal to about 100 nm, and optionally greater than or equal to about 50 nm to less than or equal to about 100 nm.

In certain variations, the thin or ultrathin semiconductor active layer 40 is an undoped amorphous silicon (a-Si) photoactive layer. A thin or ultra-thin dopant-free amorphous silicon layer may be embedded in an optical cavity as discussed above, which efficiently extracts photogenerated carriers. In other alternative variations, other silicon-based materials, such as low temperature poly-silicon (poly-Si) and nanocrystalline-silicon can also be used for the thin semiconductor photoactive layers. Thus, the semiconductor active layer 40 may comprise a semiconductor material selected from a group consisting: an amorphous silicon (a-Si), a polycrystalline silicon, an organolead halide perovskite semiconductor, an organic semiconductor, a quantum dot, an oxide semiconductor (e.g., indium gallium zinc oxide (IGZO)), a two-dimensional semiconductor, metal oxide, and combinations thereof. 2D semiconductor. By "substantially free" of doping it is meant that the layer comprising the semiconductor material, such as amorphous silicon for example does not have any intentional dopant introduced, nor is it associated with doping layers or regions. However, naturally occurring substances or impurities may be present in the layer in very minor amounts that may be considered to be dopants, thus in certain aspects, substantially free of doping may mean that the semiconductor material comprises less than or equal to about 0.5 weight % of intentionally added dopants in the material, less than or equal to about 0.1 weight % of dopants in the material, and optionally less than or equal to about 0.01 weight % of dopants in the semiconductor material.

In certain variations, the first charge (hole) transport layer 42 and second charge (electron) transport layer 44 may be substantially free of dopant. In certain variations, the first (hole) transport layer 42 and the second (electron) transport layer 44 independently comprise a metal oxide, such that they may comprise the same metal oxide or distinct metal oxide compositions. In certain variations, the first charge (hole) transport layer 42 may comprise a metal oxide and the second charge (electron) transport layer 44 may comprise an organic material.

By way of example, the first charge (hole) transport layer 42 may include a metal oxide material selected from the group consisting of: vanadium oxide ($VO_x$), molybdenum oxide ($MoO_x$), tungsten oxide ($WO_x$), nickel oxide ($NO_x$), and combinations thereof. By way of example, vanadium oxide ($VO_x$) may include vanadium pentoxide ($V_2O_5$), molybdenum oxide ($MoO_x$) may be molybdenum trioxide ($MoO_3$), tungsten oxide ($WO_x$) may be tungsten trioxide ($WO_3$), and nickel oxide may be nickel (III) oxide ($Ni_2O_3$).

The second charge (electron) transport layer 44 may comprise a metal oxide selected from the group consisting of: zinc oxide (ZnO), titanium dioxide ($TiO_2$), zinc tin oxide ($SnZnO_3$), and combinations thereof. In another variation, the second charge (electron) transport layer 44 comprises an organic material comprising indene-$C_{60}$ bisadduct (ICBA), which may thus be a thin organic layer that functions as a highly efficient photogenerated electron transport layer. ICBA's lowest unoccupied molecular orbital (LUMO) is well aligned with the a-Si conduction energy band. The ICBA may be adjacent to another organic material of bisadduct fullerene surfactant ($C_{60}$ surfactant), which can reduce the work function of the certain cathode 34 metals, such as reducing the work function of silver (Ag) for Ohmic contact between the Ag cathode 34 and the ICBA electron or second charge transport layer 44. The second charge (electron) transport layer 44 may further comprise a second layer comprising $C_{60}$ bis surfactant. In certain other variations, the second charge (electron) transport layer 44 may include other organic materials known or to be developed in the art for such applications.

While not shown in FIG. 1 or 2, the second charge (electron) transport layer 44 may be a top contact layer with respect to the surface exposed to the external environment (and the second charge (hole) transport layer 42 may be the bottom contact layer). In such variations, the second charge (electron) transport layer 44 may comprise two layers, for example, a first layer comprising zinc oxide (ZnO) (for example, ZnO nanoparticles) and a second layer or interlayer comprising an organic material, such as polyetherimide (PEI). The ZnO nanoparticles may be over-coated with a thin layer of PEI, for example, less than or equal to about 50 nm by way of example, a total thickness of both layers may be less than or equal to about 35 nm where the PEI layer has a thickness of greater than or equal to about 10 nm to less than or equal to about 15 nm.

Thus, in accordance with certain variations of the present disclosure, very thin inorganic and organic charge transport layers can be used to surround the dopant-free intrinsic (i-) a-Si active layer at the cathode and anode interfaces. The photoactive layers of the active material assembly 30 may be substantially free of any p- or n-doped regions; and, for efficient photon management, the intrinsic a-Si active layer can be designed to be ultra-thin. By way of example, in certain variations, the first charge (hole) transport layer 42 and the second charge (electron) transport layer 44 respectively have a thickness of less than or equal to about 35 nm, optionally less than or equal to about 30 nm and in certain variations, greater than or equal to about 25 nm to less than or equal to about 30 nm.

In alternative variations, the first charge (hole) transport layer 42 may comprise a p-type silicon dioxide (p-$SiO_2$, doped with boron or germanium, for example) and second charge (electron) transport layer 44 may comprise a n-type silicon dioxide (n-$SiO_2$, doped with phosphorus, for example) material. By using such a first charge (hole) transport layer 42 and second charge (electron) transport layer 44, the photodetector device can produce photodiode behavior.

The anode 32 or cathode 34 may comprise at least one conductive metal layer or select regions. At least one of the anode 32 or cathode 34 may comprise a pixel that may include select interconnected regions. Thus, at least one of the anode 32 or cathode 34 may comprise an array of a plurality of pixels. In certain variations, the electrode may comprise a metal selected from the group consisting of: silver, gold, aluminum, copper, indium, tin, and combinations thereof.

In certain aspects, the anode 32 may be a single metal layer or mesh/grating or may be a multilayered assembly, such as a dielectric-metal-dielectric assembly. In one variation, the anode 32 may comprise silver (Ag), nickel (Ni), molybdenum (Mo), indium tin oxide (ITO), and alloys and combinations thereof. The anode 32 may be metal layer, such as a thin metal layer having a thickness of less than or equal to about 120 nm. In certain configurations where the anode 32 is disposed on a surface that is visible to an external environment and the photodetector device 20 appears to be opaque to the external environment, the anode 32 may comprise a material selected from the group consisting of: silver (Ag), aluminum (Al), nickel (Ni), copper (Cu), molybdenum (Mo), palladium (Pd), and combinations thereof. In certain variations, the anode 32 may comprise a material selected from the group consisting of: silver (Ag), nickel (Ni), molybdenum (Mo), and combinations thereof.

In other variations, where the anode 32 is transparent to the predetermined range of wavelengths it may comprise a material selected from the group consisting of: indium tin oxide (ITO), fluorine-doped tin oxide (FTO), zinc tin oxide (ZTO), zinc oxide (ZnO), aluminum zinc oxide (AZO), or indium zinc oxide (IZO), and combinations thereof. In another variation where the anode 32 is transparent to the predetermined range of wavelengths, the anode 32 may be an anode assembly comprising an ultrathin layer comprising a conductive metal, like silver (Ag), disposed between a first dielectric material and a second dielectric material. The ultrathin layer may have any of the thicknesses described above in the context of the ultrathin semiconductor active layer 40. In certain variations, the ultrathin conductive metal layer has a thickness of less than or equal to about 50 nm. The first and second dielectric materials may be a first metal oxide layer and a second metal oxide layer. The metal oxides may be those described above in the context of the first charge (hole) transport layer 42. The second metal oxide layer forming part of the anode assembly may also serve as the first charge (hole) transport layer 42.

In certain variations, the cathode may comprise indium tin oxide (ITO). In other variations, the cathode 34 may have a thicker silver film, for example, having a thickness of greater than or equal to about 120 nm. In certain other aspects, the cathode 34 comprising at least one layer comprising tris(8-hydroxyquinolinato)aluminum ($Al(C_9H_6NO)_3$-Alq3), lithium fluoride (LiF), aluminum (Al), and combinations thereof.

At least one of the anode 32 or the cathode 34 is transparent to the light in the predetermined range of wavelengths. The predetermined range of wavelengths may be in the visible or infrared ranges, by way of non-limiting example. Such a light may be generated within the device in which the photodetector is incorporated, for example, in a computing device, mobile device, tablet, display, and the like. Particularly suitable visible and infrared electromagnetic radiation includes, visible light having wavelengths ranging from about 390 to about 750 nm and infrared radiation (IR) (including near infrared (NIR) ranging from about 0.75 to about 1.4 μm). Thus, the anode 32 and/or cathode 34 permits a substantial portion of the input light 60 in FIGS. 1 and 2 to transmit therethrough and thus may be considered to be transmissive to the light having the predetermined range of wavelengths. This light can then pass into the active material assembly 30 to generate current.

FIG. 2 shows an alternative variation of the photodetector device 20A that has a configuration suitable to top illumination. To the extent that the components in the photodiode photodetector device 20A are similar to those of the photodetector device 20 in FIG. 1 that shows a bottom illumination design, for the sake of brevity, they will not be repeated herein. To make the photodetector device 20A top illuminating, an assembly of multiple layers can be used to form the anode. The first electrode or anode assembly 32A is transparent to one or more predetermined wavelength ranges of light, as discussed further below. Thus, the anode assembly 32A is modified to include an ultra-thin conductive metal layer 50, for example, having a thickness of less than or equal to about 50 nm or any of the ranges described previously above. The ultra-thin conductive metal layer 50 may thus comprise a conductive metal, like silver (Ag), disposed between a first dielectric material and a second dielectric material. The ultrathin layer may have any of the thicknesses described above in the context of the ultrathin semiconductor active layer 40, for example, having a thickness of less than or equal to about 50 nm. In alternative aspects, the ultra-thin conductive metal layer 50 may be a grating comprising the electrically conductive metal or select interconnected regions of the conductive metal. The first and second dielectric materials may be a first metal oxide layer 52 and a second metal oxide layer 42A. The metal oxides may be those described above in the context of the first charge (hole) transport layer 42. The second metal oxide layer 42A forming part of the anode assembly 32A may also serve as the first charge (hole) transport layer. By using such an anode assembly 32A, the ultra-thin conductive metal layer 50 serves as a transparent conductor, sandwiched by two metal oxide layers (first metal oxide layer 52 and second metal oxide layer 42A) to increase light transmission, where one of the metal oxide layers (second metal oxide layer 42A) interfacing with the ultrathin semiconductor active layer 40 thus functions as a charge transport layer, as well.

For a dielectric-metal-dielectric anode assembly 32A, for example, as shown in FIG. 2, the first metal oxide layer 52 may be tungsten trioxide ($WO_3$), which may have an exemplary thickness of about 30 nm. The ultra-thin conductive metal layer 50 may be silver (Ag), optionally having a thickness of about 23 nm. The ultra-thin conductive metal layer 50 may also comprise aluminum (Al), by way of non-limiting example, in alternative variations. The second metal oxide layer 42A may comprise tungsten trioxide ($WO_3$) or vanadium pentoxide ($V_2O_5$), which may have a thickness of about 20 nm. The dielectric-metal-dielectric (DMD) anode assembly structures (e.g., $WO_3$—Ag—$WO_3$ or $WO_3$—Ag—$V_2O_5$) may be exploited so that a large portion of incident light can be transmitted into the photodetector device 20A and absorbed by the thin semiconductor active layer 40 in the photoactive layer assembly 30A.

The active material assembly 30A thus includes the second metal oxide layer 42A as a first charge (hole) transport layer, the semiconductor active layer 40 that comprises a photoactive material, such as a semiconductor discussed previously, and a second charge (electron) transport layer 44 that faces a cathode 34 disposed on a substrate 36.

With reference to FIGS. 1 and 2, in certain aspects, the photodetector device 20 or 20A defines a first surface 62 exposed to an external environment and a second surface 64 that is not visible, but may be facing components in the overall device in which the photodetector device 20 or 20A is incorporated. It should be noted that the present disclosure pertains to photodetector devices that are suitable for use with very low light applications, for example, where the input light 60 may have an intensity level of less than or equal to about 50 Lux, for example, less than or equal to about 40 Lux, optionally less than or equal to about 30 Lux, and in certain variations, optionally less than or equal to about 20 Lux. For various display applications, the input light intensity levels are very low and thus it has been a challenge to create effective photodetectors under such dark conditions/low input light conditions where the photodetectors exhibit a high enough response and sensitivity above background levels (for example, above dark current levels) to effectively detect fingerprints and gestures. In accordance with various aspects of the present disclosure, the photodetector devices described herein have the ability to detect fingerprints and gestures where light intensity levels are less than or equal to about 50 Lux.

In FIG. 1, where the input light 60 occurs via bottom illumination and enters the photodetector device 20 from the second surface 34, the input light 60 has a first predetermined range of wavelengths that pass through the substrate 36 and the cathode 34. The first surface 62 may reflect incident light directed thereto and may appear to be opaque (e.g., black or white) and seamlessly integrated into the surrounding screen so that it is not independently visible to an observer.

In FIG. 2, the input light 60 is directed towards the photodetector device 20A from a first surface 62A and is thus a top illumination configuration. Again, the input light 60 has a first predetermined range of wavelengths which pass through the anode assembly 32A. The anode 32 in FIG. 1 or the anode assembly 32A in FIG. 2 may transmit this first predetermined range of wavelengths of electromagnetic radiation.

In a photodetector device configuration, the hole/electron transport layers are specially designed for the a-Si semiconductor active layer and desirably have good band matching with the conduction/valance bands (CB, VB) of a-Si. As noted above, various metal oxide materials can be employed as hole transportation layers, such as vanadium oxide ($VO_x$), molybdenum oxide ($MoO_x$), or tungsten oxide ($WO_x$), due to a narrow CB aligning with the VB of a-Si, resulting in good anode contacts via efficient electron-hole recombination. As discussed above, several materials may be used as cathode contact/electron transport layers, for example, a ZnO layer or ZnO nanoparticles layer coupled with a PEI interlayer, where the dipole induced in the PEI interlayer can effectively lower the workfunction (WF) of the cathode metal.

Figure 3:
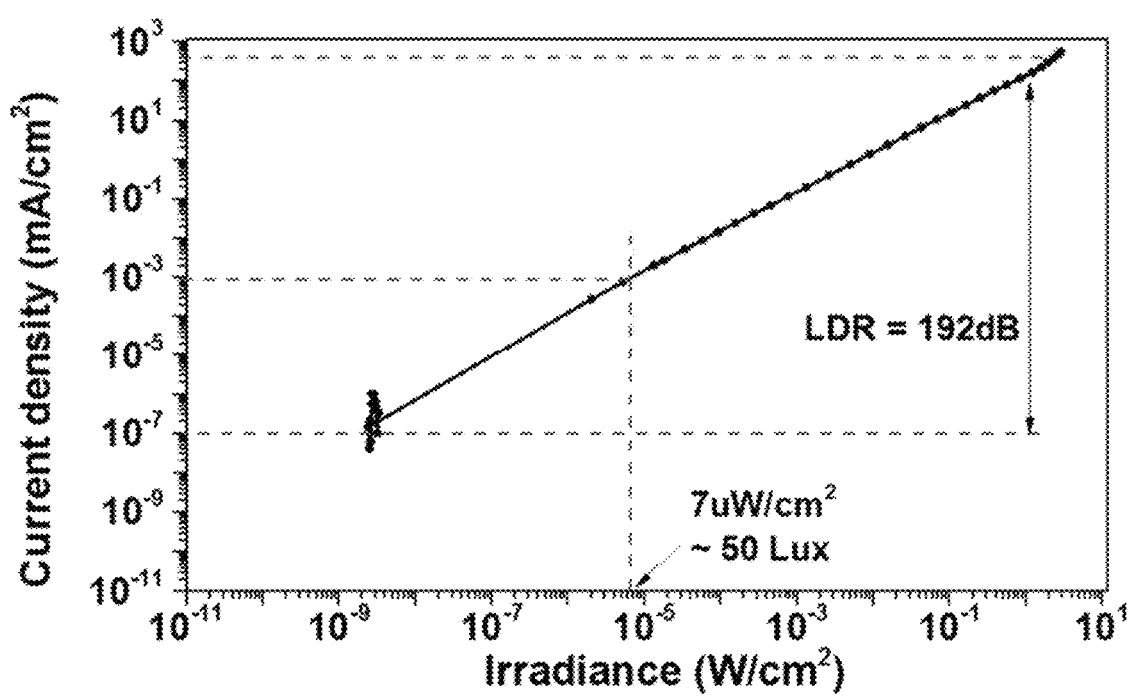
FIG. 3 shows current density versus irradiance for a photodiode photodetector prepared in accordance with certain aspects of the present disclosure.

A photodetector device incorporating such a second charge (electron) transport layer 44 having ZnO nanoparticles and a thin PEI layer shows a large linearity range for the photo-current response as a function of incident light power. FIG. 3 shows characterization of 100 μm by 500 μm pixels made of a photodetector photodiodes having a glass substrate, an anode 32 formed of indium tin oxide (ITO), a tungsten oxide ($WO_x$) first charge (hole) transport layer 42, a semiconductor active layer 40 comprising amorphous silicon (a-Si) with a thickness of about 90 nm deposited by plasma enhanced chemical vapor deposition (CVD), and the ZnO nanoparticle/PEI second charge (electron) transport layer 44, and a cathode 34 formed of aluminum. The first charge (hole) transport layer 42 and second charge (electron) transport layer 44 each have thicknesses of less than or equal to about 20 nm and are deposited by evaporation or spin-coating. In FIG. 3, there is a large range of linearity (current density versus irradiance). A current ratio for light illumination under 50 Lux is greater than or equal to about $10^2$, optionally greater than or equal to about $10^3$, and in certain variations, optionally greater than or equal to about $10^4$, where the photocurrent is measured at voltage bias between (0 to approximately −5V). In certain aspects, a current ratio of greater than or equal to about $10^2$ to less than or equal to about $10^4$ is acceptable for detecting fingerprints. A suitable ratio for such an application may depend on peripheral circuitry used to amplify the detected signal. FIGS. 4A and 4B show calculated responsivity and quantum efficiency of such a photodetector photodiode device. As shown, the responsivity and external quantum efficiency (EQE) both reach an average value (approximately 0.15 A/W responsivity and about 34% EQE for an irradiance of greater than about $10^{-5}$) from under sufficient light illumination power.

Another variation of a second charge (electron) transport layer is ICBA or C60, together with ultrathin comprising tris(8-hydroxyquinolinato)aluminum ($Al(C_9H_6NO)_3$-Alq3) and lithium fluoride (LiF)/aluminum (Al) electrodes, because the energy barrier is mediated barrier by the LUMO of ICBA/C60, Alq3 as well as the doping effect of LiF for the cathode metals. In the bottom illumination configuration shown in FIG. 1, where the input light 60 enters the second surface 64, transparent conductive oxide or ultrathin metal layers can be used as the bottom transparent electrodes (e.g., cathode 34). Thicknesses of each individual layer can be selected for optimal electrical performance.

In certain variations, a device may comprise a plurality of photodetector devices prepared in accordance with the present disclosure. For example, FIG. 5 shows an array of about 16 photodiode photodetectors where each defines a pixel having a size of about 100 micrometers by about 500 micrometers. The photodiode detectors have a bottom illumination configuration. The photograph shows the top aluminum electrodes, where the photodiode detectors have a configuration like that described in the context of FIG. 3. A light beam having an intensity of about 50 Lux illuminates the array from the bottom side onto pixels #1 to approximately #7. In this manner, the light beam only illuminates select pixels (#1-#7), while leaving others under dark conditions. A photo-current response from each pixel is shown in FIG. 6A (photocurrent versus photodiode index #1-16), while a few representative examples of current versus voltage (I-V curves) for photodiodes/pixels #4, #7, and #12, are shown in FIG. 6B as well. In the testing, the light beam covers photodiode/pixels #1 to #7. The dark current ($I_{dark}$) and photocurrent ($I_{ph}$) are in an appropriate range, where the $I_{dark}$ is around $-4\times10^{-12}$ A, and $I_{ph}$ is around $-4.5\times10^{-10}$ A. A ratio of the dark to illuminated areas (e.g., on/off ($I_{ph}/I_{dark}$) ratio where $I_{ph}$ is current for the photodiode when illuminated and $I_{dark}$ is dark current in the absence of illumination) is maximized and optionally ranges from greater than or equal to approximately 100, optionally greater than or equal to about $10^3$, and in certain variations, optionally greater than or equal to about $10^4$.

FIG. 7 shows current versus voltage performance (I-V curves) for a bottom illuminated photodiode photodetector design (like that shown in FIG. 1) having a glass substrate, an anode comprising silver (Ag) having a thickness of about 100 nm, a first charge (hole) transport layer comprising molybdenum oxide ($MoO_x$) with a thickness of about 10 nm, a semiconductor active layer comprising amorphous silicon (a-Si) with a thickness of about 90 nm deposited by plasma enhanced chemical vapor deposition (PECVD), a second charge (electron) transport layer comprising ZnO deposited via ALD with a thickness of about 20 nm, and a cathode comprising indium tin oxide (ITO) having a thickness of about 110 nm. In FIG. 7, the performance of the photodiode photodetector under illumination and under darkness is shown.

FIG. 8 shows current versus voltage performance (I-V curves) performance for another bottom illuminated photodiode photodetector device (like that shown in FIG. 1) under darkness and illumination prepared in accordance with other variations of the present disclosure. The photodiode photodetector has a glass substrate, an anode comprising nickel (Ni) having a thickness of about 120 nm, a first charge (hole) transport layer comprising molybdenum oxide ($MoO_x$) with a thickness of about 10 nm, a semiconductor active layer comprising amorphous silicon (a-Si) with a thickness of about 90 nm deposited by plasma enhanced chemical vapor deposition (PECVD), a second charge (electron) transport layer comprising a ZnO layer deposited by ALD and having a thickness of about 20 nm, and a cathode comprising indium tin oxide (ITO) having a thickness of about 110 nm.

In various aspects, the use of a thin semiconductor active layer comprising amorphous silicon (a-Si) for example, can be a particularly advantageous structure for various applications including high-speed photo-detectors, based on the transient photocurrent and photovoltage characteristics of the undoped a-Si hybrid devices. Thin a-Si hybrid devices have very fast responses to the stimulated light input, thereby making them suitable for use in high-speed photodetectors. In certain aspects, a photodetector having a high-speed and/or fast response refers to a response time (where a change in the photocurrent occurs due to detecting the presence of a finger or a gesture) is on the order of about 1 microsecond (for example, less than or equal to about 1 μsec). Such device desirably exhibit suppressed dark current as well, which can improve a signal-to-noise ratio of the photo-detector device. A photodetector device comprising a photodetector array based on an a-Si hybrid design demonstrates high-speed performance. Such a-Si hybrid photodetector arrays can be built for a transparent human touch interactive screens, where photocurrent density shifts if the detector cell is touched or blocked from surrounding light. Because certain variations of photodetector hybrid devices having an ultra-thin a-Si (a few nanometer-thick) provide optical transparency, the hybrid device can operate as a UV light-blocking window, creating electric power as well, due to strong UV light absorption by even a single nanometer thick a-Si active material.

In FIG. 9, an embodiment of a bottom-illuminating photodetector device in an array format 70 is shown. The hybrid photodetector device 70 includes a first electrode or anode assembly 72 and a second electrode or cathode 74. The anode assembly 72 is a dielectric-metal-dielectric anode assembly, for example, as shown in FIG. 2. A first dielectric material may be a first metal oxide layer 76 that is disposed over substrate 77. In certain variations, the first metal oxide layer 76 may be tungsten trioxide ($WO_3$), which may have an exemplary thickness of about 30 nm. A second dielectric material may be a second metal oxide layer 78. The second metal oxide layer 78 may have the same composition as the first metal oxide layer. In certain variations, the second metal oxide layer 78 may be tungsten trioxide ($WO_3$), which may have an exemplary thickness of about 10 nm. A plurality of conductive metal regions 80 may be formed within the second metal oxide layer 78 (or the second metal oxide layer 78 may be formed around the conductive metal regions 80). The conductive metal regions 80 may comprise silver (Ag), optionally having a thickness of about 15 nm or thinner.

The anode assembly 72 is disposed adjacent to the active material assembly 82. The active material assembly 82 includes a semiconductor active layer 84 that comprises a photoactive material, such as a semiconductor like a dopant-free amorphous silicon (a-Si), for absorbing light and generating electric charge, as discussed previously above. In certain aspects, the semiconductor active layer 84 may have a thickness ranging from greater than or equal to about 50 nm to less than or equal to about 100 nm depending on the amount of photocurrent to be generated (where a thicker semiconductor active layer 84 generates more photocurrent).

The active material assembly 82 may also include at least one charge transport layer like those described previously above. Thus, the active material assembly 82 may include a first charge transport layer 86 disposed between the semiconductor active layer 84 and the anode assembly 72, which may serve as a hole transport layer (to transport holes between the anode assembly 72 and semiconductor active layer 84). The active material assembly 84 may also include a second charge transport layer 88 disposed between the semiconductor active layer 84 and the cathode 74, which serves as an electron transport layer (to transport electrons between the semiconductor active layer 84 and the cathode 74). The anode 72 and cathode 74 thus sandwich the active material assembly 82. The first charge transport layer 86 may be a metal oxide, as described previously above, for example, it may be vanadium pentoxide ($V_2O_5$) having a thickness of about 10 nm, in one variation. The second charge transport layer 88 may include any of the materials described above, for example, an indene-C60 bisadduct (ICBA) that may be used for photogenerated charge extraction. An interfacial layer 90 may be disposed between the second charge transport layer 88 and cathode 74. The cathode 74 may comprise aluminum (Al) at a thickness of about 5 nm and/or or silver (Ag). The interfacial layer 90 comprises tris(8-hydroxyquinoline) aluminum (Alq3) for Ohmic contact with aluminum. The Alq3 may be thermally evaporated to a thickness of about 2 nm right before Al deposition. Notably, photo-detector arrays may be formed with crossbar type cathode and anode, for example, as shown in FIG. 11.

A thin a-Si hybrid photodetector device structure like that in FIG. 9 shows very fast photo-response that is particularly suitable for high-speed photo-detector applications. The outstanding photo-response, either in photocurrent or photovoltage, provides transient rise and fall time within 1 microsecond (μs). For example, FIG. 10 shows high speed photo-response of the rise and fall time, which is less than 1 microsecond, in the current density of the a-Si hybrid photodetector design like that described in the context of FIG. 9. The photodetector in FIG. 10 greatly outperforms the reported fastest response of 0.3 msec in conventional a-Si/$MoS_2$ photo-detector. Moreover, the ultra-thin a-Si hybrid structure like that in the embodiment in FIG. 9 satisfies commercial photo-detector sensitivity requirements as well, by producing high quantum efficiency over low dark current density (greater than about $5 \times 10^{-8}$ $cm^2/A$).

With the photodetector device structure like that in FIG. 9, 4 by 4 arrays can be made by implementing data-read analog circuits and user interface software, where real-time detection of over 700 frames/second is used. With an input light (520 nm green LED) source illuminating the photo-detector arrays, the photo-detector arrays can recognize the light intensity distribution and respond with the corresponding amplitude of electric current at short circuit condition. Furthermore, the present disclosure contemplates applying higher resolution real-time imaging systems using high-speed a-Si hybrid photo-detector arrays. Photo-detector arrays may be formed with crossbar type cathode and anode, for example, as shown in FIG. 11. The array of photodetector pixels shown in FIG. 11 is a 16×16 array, although other numbers, such as 32×32 arrays are also contemplated.

The real-time imaging system can be also designed to run faster by employing a central processing unit (CPU) and input/output peripherals of field programmable gate arrays (FPGAs). By integrating the a-Si hybrid detector arrays with system-on-a-chip such as FPGA, in medical applications as an example, the digital radiography can employ the hybrid photo-detector array solution in flat panel detectors (FPD). If an optimized scintillator is equipped, which converts X-ray to visible light in the wavelength range of about 500 nm to about 600 nm, the a-Si hybrid photo-detector arrays receive continuous frames of a video in real time. Here the major figures of merits for photo-detectors in FPDs are the sensitivity and speed of the visible light detection. It is believed that the faster response by the a-Si hybrid photo-detectors along with high sensitivity leads to high frame-rate video with short X-ray exposure time and dose in the surgical imaging system.

For the undoped a-Si hybrid devices, the high internal quantum efficiency (IQE) is attributed to the thin a-Si thickness in the photoactive layer, which is smaller than the charge diffusion length, thereby suppressing possible electric charge losses. For the reduced dark current (FIG. 12), the hybrid charge transport layers contribute to selective charge extraction at electrodes, mitigating unwanted charge leakage. FIG. 12 shows suppression of dark current by introducing an Alq3 (2 nm thickness) interfacial layer at an aluminum cathode in the a-Si hybrid device structure. The additional Alq3 layer (0-3 nm) is applied beneath ICBA to reduce the dark current.

At electron charge transporting interface, it is shown that the ICBA charge transport layer double sandwiched by $Alq_3$ layers with one $Alq_3$ (2 nm) right next to aluminum electrode significantly suppresses dark current. Moreover, according to the ultra-thin a-Si engineered by the undoped principle, the accurate optical design to maximize EQE in any visible wavelength is also available regardless of scintillator type in medical imaging. In addition, the simplicity of fabrication is another advantage that permits scaling of the device to large-size detector panel.

Another common approach for photodetection is by using photoconductors. However in order to obtain higher photocurrent to dark current ratios (e.g., significantly higher than $10^2$) for low-light detection (e.g., lower than 50 Lux) used in finger print identification, other designs may be warranted. By way of example, photodetection based on a modified photoconductor structure is shown in FIG. 13, where a phototransistor photodetector device 100 is shown. Notably, where not specifically addressed, the materials and design for forming the components in the phototransistor photodetector device 100 may be the same as those described above in the context of the photodiode photodetectors. The phototransistor photodetector device 100 includes a first electrode 110 that can serve as a source electrode, a second electrode 112 that can serve as a drain electrode. In certain variations, like that shown, the phototransistor photodetector device 100 includes a third electrode 114 that can serve as a gate electrode. The third electrode 114 can function to modulate the charge density in a semiconductor active layer, as will be described in more detail below. Such a third electrode may be included where the first electrode 110 and the second electrode 112 together may not adequately satisfy the low light detection requirements. The first electrode 110 and the second electrode 112 may be in electrical contact with a first layer 120 comprising a semiconductor material. A charge distribution region, for example, a charge donor or acceptor region 124 may be disposed within the first layer 120. The charge donor or acceptor region 124 comprises a material selected from the group consisting of: quantum dots, two dimensional (2D) semiconductors, graphene, a semiconductor having distinct bandgap and offset band edges, and combinations thereof.

A semiconductor active layer 130 is disposed adjacent to the charge donor or acceptor region 124. The semiconductor active layer 130 is in contact with the first electrode 110 and the second electrode 120 and serves as a conducting channel for charge within the phototransistor photodetector device 100. In one aspect, the semiconductor active layer 130 comprises a material selected from the group consisting of: amorphous silicon (a-Si), indium gallium zinc oxide (IGZO), other metal oxides, an organic semiconductor, a polycrystalline silicon, a two-dimensional semiconductor, and combinations thereof.

An insulator layer 134 defines a first side 136 and an opposite second side 138. The first side 136 of insulator layer 134 is disposed adjacent to the semiconductor active layer 130. The second side 138 is disposed adjacent to the third electrode 114. The third electrode 114 may be disposed on a substrate 140, such as glass. The insulator layer 134 thus electrically insulates and separates the third electrode 114 (e.g., the gate electrode) from the semiconductor active layer 130. Suitable insulating materials to form the insulator layer 134 include silicon oxide, silicon nitride, metal oxides, such as hafnium oxide ($HfO_2$), or insulating polymers known in the art. In certain aspects, the photodetector device is a phototransistor that transmits light 132 in a predetermined range of wavelengths into the device 100, such as any of those wavelengths described previously above. Such a phototransistor photodetector device can exhibit a photocurrent/dark current ratio of greater than or equal to about $10^2$ (or optionally the other ratios discussed above). Furthermore, such a phototransistor photodetector device may exhibit a responsivity of greater than or equal to about $10^3$ A/W. Moreover, an array of such phototransistor photodetector device 100 is capable of generating detecting human fingerprints or gestures under an illumination of light with an intensity of less than or equal to about 50 Lux.

The semiconductor active layer 130 channel and first and second electrodes/contacts 110, 112 generally represent the photoconductor. To suppress the dark current, a back gate in the form of the third electrode 114 can be used to deplete the charge present in the semiconductor active layer 130 channel. When light 132 is illuminated, a certain amount of photo-generated charges can travel through the semiconductor active layer 130 channel and can be collected by first and second contact electrodes 110 and 112. The third electrode 114 back gate bias can be synchronized with the light illumination for improved photo-current collection. A heterojunction structure can be used for light detection: an additional material 124 can be deposited as a charge donor or acceptor layer on top at least a portion of the semiconductor active layer 130 channel and the two form a type II heterojunction alignment shown in FIG. 13. The pair of materials can function as charge donor or acceptor upon light absorption. One benefit of this configuration is that photo-conductive gain can be exploited: if the charge storage lifetime on the charge donor/acceptor region 124 is longer than the charge transit time through the semiconductor active layer 130 channel, the measured photocurrent will experience a gain equal to the ratio of these two time constants. For example, the semiconductor active layer 130 channel can be made to be shorter to significantly reduce the charge transit time to have a large gain. Additionally, the contacts (first and second electrodes 110, 112) for the semiconductor active layer 130 channel do not need to the same. One side can be made to produce rectifying behavior to help suppress the collection of dark current.

FIG. 14 shows an embodiment of such a pair of materials for the semiconductor active layer 130 channel and the charge donor or acceptor region 124. The semiconductor active layer 130 may be an inorganic material, such as low temperature polycrystalline silicon (LTPS) that interfaces with an organic semiconductor material or layer, such as perylene tetracarboxylic dianhydride (PTCDA). With proper band offset, upon light absorption excitons formed in the organic semiconductor can be efficiently separated and charge transfers to the inorganic semiconductor channel that provides high charge mobility. The benefits of such a coupling configuration can provide high light absorption by thick inorganic semiconductor materials with an appropriate bandgap. Further, more efficient exciton separation is contemplated due to large band offset between highest occupied molecular orbit (HOMO) energy level and valence band edge. Further, efficient charge collection is possible due to higher charge mobility in the inorganic semiconductor active material channel.

Based on the device structure in FIG. 9, a transparent ultra-thin a-Si hybrid photo-detector can be fabricated. If the transparent a-Si photo-detectors are integrated with an interactive screen, the transparent detector arrays can detect human touch and harvest light energy at the same time when desired. FIG. 15 shows a hybrid photodetector device 150 that is capable of serving as a photovoltaic device, where both cathode and anode are transparent electrodes. The hybrid photodetector device 150 includes a first electrode or anode assembly 152 and a second electrode or cathode 154. The anode assembly 152 is a dielectric-metal-dielectric anode assembly that is transparent to a white illumination light 156, for example, generated by the display device in which the hybrid photodetector device 150 is incorporated. A first dielectric material may be a first metal oxide layer 160 that is optionally disposed over a transparent substrate (not shown). In certain variations, the first metal oxide layer 160 may be tungsten trioxide ($WO_3$), which may have an exemplary thickness of about 25 nm. A second dielectric material may be a second metal oxide layer 162. The second metal oxide layer 162 may have the same composition as or be distinct from the first metal oxide layer 160. In certain variations, the second metal oxide layer 162 may be vanadium pentoxide ($V_2O_5$), which may have an exemplary thickness of about 15 nm. A plurality of conductive metal regions 164 may be formed within the second metal oxide layer 162. The conductive metal regions 164 may comprise silver (Ag), optionally having a thickness of less than or equal to about 15 nm.

The anode assembly 152 is disposed adjacent to an active material assembly 170. The active material assembly 170 includes a semiconductor active layer 172 that comprises a photoactive material, such as a semiconductor like a dopant-free amorphous silicon (a-Si), for absorbing light and generating electric charge, as discussed previously above. In certain aspects, the semiconductor active layer 172 may have a thickness ranging from greater than or equal to about 10 nm to less than or equal to about 25 nm, for example, about 13 nm in one variation.

The active material assembly 170 may also include at least one charge transport layer like those described previously above. Thus, the active material assembly 170 may include the second metal oxide layer 162 as a charge transport layer disposed adjacent to the semiconductor active layer 172 that may serve as a hole transport layer (to transport holes between the anode assembly 152 and semiconductor active layer 172). The active material assembly 170 may also include a second charge transport layer 174 disposed between the semiconductor active layer 172 and the cathode 154, which serves as an electron transport layer (to transport electrons between the semiconductor active layer 172 and the cathode 154). The second charge transport layer 174 may include any of the materials described above, for example, an indene-C60 bisadduct (ICBA) that may be used for photogenerated charge extraction. An interfacial layer 176 may be disposed between the second charge transport layer 174 and cathode 154. The interfacial layer 176 may comprise $C_{60}$ bis surfactant). The cathode 154 is advantageously transparent to select wavelengths of ambient light 180 in the visible light range. The cathode 154 may comprise silver (Ag) and tungsten trioxide ($WO_3$). As shown, the hybrid photodetector device 150 has a first surface 182 that interacts with a human finger 184, by way of example. A second surface 186 of the hybrid photodetector device 150 faces the white illumination light 156. In this manner, the hybrid photodetector device 150 provides a transparent a-Si hybrid photo-detector for human touch interact screen products that is capable of harvesting light energy for electric power, as well as serving as a photodetector for fingerprint or gesture recognition.

In certain aspects, the present disclosure provides photodetectors that can be incorporated into human touch interactive transparent screen products. If the human finger 184 approaches or touches the transparent cathode 154, the a-Si hybrid photo-detector senses it by recording the photocurrent density shift regardless of ambient light on top of the hybrid photodetector device 150 (e.g., an array).

The photocurrent density varies according to human touch on the photo-detector arrays (Photo sensitivity: 50 mA/W) as shown in FIG. 16. The photocurrent characteristics clearly show that, with a touch on the photo-detector cathode, about 15% photocurrent shift is detected, which is large enough to sense whether the detector pixel is selected or not. In the experiment, white light illumination is used as a back light source for a general display screen. With the finger approaching on the photo-detector pixel, the white light is reflected from the finger skin so that the a-Si of the pixel absorbs more light to increase the current density. Here the photosensitivity of 50 mA/W plays an important role in touch sensitivity. As will be recognized by those of skill in the art, these values are not necessarily limiting, as the operation or principle can vary according to the display system where the photo-detector arrays are incorporated.

Because recent or future displays are continuously getting bigger, the photo-detector arrays should be scalable in production. FIG. 17 illustrates an example of a method of fabrication of the transparent arrays with a-Si sandwiched by crossbar type cathode and anode grids that are transparent as well. As shown, the anode is a transparent anode grid or grating, the cathode is a transparent cathode grid or grating, the active material assembly includes the ultra-thin a-Si and ICBA layers. After assembly, the two-dimensional arrays collect the information about location of a finger touch point that is on an opposite side from backlight illumination as indicated with x and y axes lines.

EXAMPLES

A thin a-Si hybrid photodetector device structure like that in FIG. 9 shows very fast photo-response that is particularly suitable for high-speed photo-detector applications. The outstanding photo-response, either in photocurrent or photovoltage, provides transient rise and fall time within 1 microsecond (μs). For example, FIG. 10 shows high speed photo-response of the rise and fall time, which is less than 1 microsecond, in the current density of the a-Si hybrid photodetector design like that described in the context of FIG. 9. The photodetector in FIG. 10 greatly outperforms the reported fastest response of 0.3 msec in conventional a-Si/$MoS_2$ photo-detector. Moreover, the ultra-thin a-Si hybrid structure like that in the embodiment in FIG. 9 satisfies commercial photo-detector sensitivity requirements as well, by producing high quantum efficiency over low dark current density (greater than about $5 \times 10^{-8}$ $A/cm^2$).

Photodiode performance of a thin a-Si photo-detector prepared in accordance with certain aspects of the present disclosure is compared with a crystalline silicon (c-Si) photodiode having features as listed in Table I.

In one variation, an a-Si/organic photodetector is constructed on a transparent fused silica substrate. The main components of the hybrid cells are an anode, an ultra-thin a-Si layer, and a cathode. For the anode, a dielectric-metal structure (e.g., tungsten trioxide ($WO_3$)—Ag) is used to produce relatively high transmission. Following the anode, a high work function vanadium oxide ($V_2O_5$) serves as a hole-transporting layer for the undoped a-Si and simultaneously blocks electrons. Following the deposition of the a-Si layer, a thin organic layer of indene-$C_{60}$ bisadduct (ICBA) may be deposited to serve as an electron-transporting layer for the a-Si, because ICBA's lowest unoccupied molecular orbital (LUMO) is well aligned with the a-Si conduction energy band. Another organic material of bis-adduct fullerene surfactant ($C_{60}$ surfactant) is spin cast on top of the ICBA to lower the Ag work function, thus forming an Ohmic contact between the ICBA and the Ag cathode. All anode and cathode materials, except the ICBA, were thermally evaporated with the same thicknesses, regardless of the device type, without breaking the vacuum below $1 \times 10^{-6}$ br. The ICBA was spin cast. The undoped a-Si layers are deposited using a plasma-enhanced chemical vapor deposition (PECVD) tool.

All the anode and cathode materials, except ICBA and C60 surfactant, may be thermally evaporated for the same thicknesses, regardless of device types, without breaking the vacuum below $1 \times 10^{-6}$ mbar. The ICBA and C60 surfactant are spin cast all in the same conditions as well. An anode of $WO_3$/Ag is thermally deposited onto a fused silica substrate, producing a sheet resistance below 6 ohm/sq. In the same chamber, without breaking the high vacuum ($10^{-6}$ mbar), $V_2O_5$ is deposited at a rate of 0.2 Ås$_{-1}$ to form a hole-transport layer. An undoped a-Si photoactive layer is deposited at 240° C. using $SiH_4$ gas in a PECVD apparatus with 13.56 MHz RF power. To create electron-transporting and Ag work function tuning layers, ICBA/chlorobenzene solution and $C_{60}$ surfactant are then spin cast onto the a-Si layer. Finally, thick Ag is thermally evaporated on top of the previous layers as a cathode electrode and a strong reflector. In this manner, a dual-function a-Si/organic hybrid solar cell and photodetector is built on a transparent fused silica substrate, as the reflected light from the top metals passes through.

Table I shows a comparison between the comparative crystalline silicon photodiode and an ultra-thin a-Si (thickness of about 60 nm) diode prepared in accordance with certain aspects of the present disclosure, emphasizing the benefits of the ultra-thin a-Si hybrid device.

TABLE I

| | Crystalline Si photodiode* | Ultra-thin a-Si (60 nm) diode |
|---|---|---|
| Maximum spectrum range [nm] | 190~1100 | 150~700 |
| Photo sensitivity [A/W] @ 520 nm | 0.3 | 0.15 |
| Dark current density [nA/cm$^2$] | 0.4 @ −1 V | 4 @ −1 V |
| Operation bias [V] | −20~−1 | 0 |
| Rise time [nsec] | 10~250 | 1000 |
| Cut-off frequency [MHz] | 10~2000 @ Reverse bias | 1 @ Zero bias |
| Various photo-response spectrum | Filter is needed | Tunable |
| Large area diode | Up to 3 cm by 3 cm | Determined by vacuum chamber size |
| Integration with a system | Complex | Easy |

*Sources: Hamamatsu, Inc., OSI optoelectronics.

Notably, the a-Si hybrid photo-detector prepared in accordance with certain aspects of the present disclosure operates at zero bias without any reverse bias voltage, which is required for c-Si photodiode. Also, a photo-response spectrum can be easily modulated by optically designing the multi-layer a-Si hybrid structures, thereby tuning a-Si absorption spectrum accordingly. Because a-Si is deposited by plasma enhanced chemical vapor deposition (PECVD) in vacuum with solution-casting and thermal evaporation for the other layers, the fabrication of the hybrid photo-detector arrays is scalable, which is not true for the c-Si photodiode. The a-Si hybrid photo-detector has well suppressed dark current density, thus it is comparable even to c-Si detector just by around one order of magnitude difference.

In another example, n-type low-temperature-polysilicon (LTPS) thin-film-transistors (TFT) are measured to observe the photo-response. The TFT is fabricated using the top-gate structure with the self-aligned source/drain regions and the gate-insulator (G/I) was formed by silicon-oxide of 120 nm thickness. The G/I had an oxide capacitance ($C_{ox}$) of 7.09 pF/cm$^2$ which was calculated by a capacitance-voltage (C-V) characterization shown in FIG. 18A. As a result, FIG. 18B shows the transfer-curves via the n-LTPS TFT with the channel length ($L_{ch}$) and width ($W_{ch}$) for 10 μm and 50 μm. It reported the electron saturation mobility ($μ_{sat}$) of 127 cm$^2$/V-s and the sub-threshold swing (SS) of 0.34 V/dec at the drain-source voltage ($V_{ds}$) of 10V.

FIG. 19A clearly shows the photo-responses on the n-type LTPS-TFT under the turn-off gate-bias conditions and the light exposure using a white LED which was enough to generate photo-excited electron-hole pairs and the photocurrent ($I_{ph}$). In addition, FIG. 19A reveals the $I_{ph}$ was strongly dependent on the gate-bias and the ratio of on/off ($I_{ph}/I_{dark}$) was the largest with at $V_g$=0V as shown in FIG. 19B. In this sense, the sensitivity of the photo-response can be optimized by decreasing the $I_{dark}$ and the $I_{ph}$. The $I_{ph}$ was also detected at the gate-bias of 1V in the channel-on region. Unfortunately, the $I_{ph}$ is not competitive to the $I_{dark}$ so the on/off ratio is not significantly high, approximately 45 in this case. This example also shows that certain designs of a photoconductor alone are not likely be able to provide the needed current on/off ratio specified earlier, i.e. greater than or equal to about 10$^2$. However, if another photo-absorption layer is introduced at the back interface of the LTPS, for example, like that shown in FIG. 13 and photoconductive gain is exploited, the ratio can be increased significantly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A photodetector device comprising:
   a first electrode;
   a second electrode; and
   a photoactive layer assembly disposed between the first electrode and the second electrode, wherein the photoactive layer assembly comprises a first charge transport layer, a second charge transport layer, and a semiconductor layer having a thickness of less than or equal to about 100 nm that is substantially free of doping and comprises amorphous silicon (a-Si), polycrystalline silicon, or combinations thereof disposed between the first charge transport layer and the second charge transport layer, wherein the photodetector device has a ratio of photocurrent to dark current of greater than or equal to about 10$^2$ measured at a voltage bias of 0 to about −5V.

2. The photodetector device of claim 1, wherein at least one of the first electrode or the second electrode is transparent to light in a predetermined range of wavelengths.

3. The photodetector device of claim 1, wherein the photodetector device defines a first surface exposed to an external environment that is opaque and the first electrode comprises a material selected from the group consisting of: silver (Ag), aluminum (Al), nickel (Ni), copper (Cu), molybdenum (Mo), palladium (Pd), and combinations thereof.

4. The photodetector device of claim 3, wherein the first electrode is an anode comprising a material selected from the group consisting of: silver (Ag), nickel (Ni), molybdenum (Mo), and alloys and combinations thereof.

5. The photodetector device of claim 1, wherein the first electrode is transparent to light in a predetermined range of wavelengths, wherein the first electrode comprises a material selected from the group consisting of: indium tin oxide (ITO), fluorine-doped tin oxide (FTO), zinc tin oxide (ZTO), zinc oxide (ZnO), aluminum zinc oxide (AZO), or indium zinc oxide (IZO), and combinations thereof.

6. The photodetector device of claim 1, wherein the first electrode is an anode and the second electrode is a cathode, wherein the first charge transport layer is a hole transport layer disposed between the anode and the semiconductor layer and the second charge transport layer is an electron transport layer disposed between the semiconductor layer and the cathode.

7. The photodetector device of claim 1, wherein the semiconductor layer has a thickness of less than or equal to about 35 nm and the first charge transport layer and the second charge transport layer respectively have a thickness of less than or equal to about 20 nm.

8. A device comprising an array of the photodetector devices of claim 1 as pixels, wherein the device is capable of generating detectable photocurrent when light with a light intensity of less than or equal to about 50 Lux is directed towards the photodetector device.

9. A photodetector device comprising:
   a first electrode;
   a second electrode;
   a charge donor or acceptor region comprising a material selected from the group consisting of: quantum dots, two-dimensional (2D) semiconductors, graphene, a semiconductor having distinct bandgap and offset band edges, and combinations thereof;
   a semiconductor active layer disposed adjacent to the charge donor or acceptor region and in contact with the first electrode and the second electrode that serves as a conducting channel, wherein the semiconductor active layer has a thickness of less than or equal to about 100 nm, is substantially free of doping, and comprises amorphous silicon (a-Si), polycrystalline silicon, or combinations thereof; and
   an insulator layer defining a first side disposed adjacent to the semiconductor active layer and a second side opposite to the first side, wherein a third electrode is disposed adjacent to the second side of the insulator layer, wherein the photodetector device is a phototransistor that transmits light in a predetermined range of wavelengths.

10. The photodetector device of claim 9 having a responsivity of greater than or equal to about 10$^3$ A/W.

11. A device comprising an array of the photodetector devices of claim 9 as pixels, wherein the device is capable of generating detectable photocurrent when light with a light intensity of less than or equal to about 50 Lux is directed towards the photodetector device.

12. The photodetector device of claim 9, wherein the semiconductor active layer has a thickness of less than or equal to about 35 nm.

13. A photodetector device comprising:
a first electrode that is an anode;
a second electrode that is a cathode; and
a photoactive layer assembly disposed between the first electrode and the second electrode, wherein the photoactive layer assembly comprises a first charge transport layer that is a hole transport layer, a second charge transport layer that is an electron transport layer, and a semiconductor layer having a thickness of less than or equal to about 100 nm that is substantially free of doping and comprises amorphous silicon (a-Si), polycrystalline silicon, an oxide semiconductor, or combinations thereof disposed between the first charge transport layer and the second charge transport layer, wherein the first charge transport layer is disposed between the first electrode and the semiconductor layer and the second charge transport layer is disposed between the semiconductor layer and the second electrode and the photodetector device has a ratio of photocurrent to dark current of greater than or equal to about $10^2$ measured at a voltage bias of 0 to about −5V.

14. The photodetector device of claim 13, wherein the hole transport layer and the electron transport layer independently comprise a metal oxide.

15. The photodetector device of claim 13, wherein the hole transport layer comprises a metal oxide and the electron transport layer comprises an organic material.

16. The photodetector device of 13, wherein the hole transport layer comprises a metal oxide selected from the group consisting of: vanadium oxide ($VO_x$), molybdenum oxide ($MoO_x$), tungsten trioxide ($WO_x$), nickel oxide ($NiO_x$), and combinations thereof.

17. The photodetector device of 13, wherein the electron transport layer comprises a metal oxide selected from the group consisting of: zinc oxide (ZnO), titanium dioxide ($TiO_2$), zinc tin oxide ($SnZnO_3$), and combinations thereof.

18. The photodetector device of claim 13, wherein the electron transport layer comprises a first layer comprising zinc oxide (ZnO) nanoparticles and a second layer comprising polyetherimide (PEI).

19. The photodetector device of claim 13, wherein the hole transport layer comprises a p-type silicon dioxide (p-$SiO_2$) and the electron transport layer comprises an n-type silicon dioxide (n-$SiO_2$) material.

20. A photodetector device comprising:
a first electrode that is transparent to light in a predetermined range of wavelengths and comprises an ultrathin layer comprising silver (Ag) disposed between a first metal oxide layer and a second metal oxide layer;
a second electrode; and
a photoactive layer assembly disposed between the first electrode and the second electrode, wherein the photoactive layer assembly comprises a semiconductor layer having a thickness of less than or equal to about 100 nm that is substantially free of doping and comprises amorphous silicon (a-Si), polycrystalline silicon, an oxide semiconductor, or combinations thereof, the semiconductor layer disposed between the second metal oxide layer of the first electrode that serves as a hole transport layer and a second charge transport layer, wherein the photodetector device has a ratio of photocurrent to dark current of greater than or equal to about $10^2$ measured at a voltage bias of 0 to about −5V.

* * * * *

UNITED STATES PATENT AND TRADEMARK OFFICE
CERTIFICATE OF CORRECTION

PATENT NO. : 12,089,424 B2  
APPLICATION NO. : 17/423814  
DATED : September 10, 2024  
INVENTOR(S) : Guo et al.

Page 1 of 1

It is certified that error appears in the above-identified patent and that said Letters Patent is hereby corrected as shown below:

On the Title Page

At page 2, Column 2, Other Publications, Line number 9, delete "Molybdenm" and insert --Molybdenum--.

In the Claims

At Column 23, Claim number 16, Line number 36, after "of" insert --claim--; and

At Column 24, Claim number 17, Line number 4, after "of" insert --claim--.

Signed and Sealed this  
Twenty-fifth Day of February, 2025

Coke Morgan Stewart  
*Acting Director of the United States Patent and Trademark Office*